(12) United States Patent
Okamura

(10) Patent No.: US 10,599,031 B2
(45) Date of Patent: Mar. 24, 2020

(54) GLASS SUBSTRATE FOR MASK BLANK, MASK BLANK AND PHOTOMASK

(71) Applicant: AGC Inc., Chiyoda-ku (JP)

(72) Inventor: Yuzo Okamura, Tokyo (JP)

(73) Assignee: AGC Inc., Chiyoda-ku (JP)

( * ) Notice: Subject to any disclaimer, the term of this patent is extended or adjusted under 35 U.S.C. 154(b) by 249 days.

(21) Appl. No.: 15/881,968

(22) Filed: Jan. 29, 2018

(65) Prior Publication Data

US 2018/0217492 A1   Aug. 2, 2018

(30) Foreign Application Priority Data

Jan. 30, 2017   (JP) ................................ 2017-014710

(51) Int. Cl.

| | | |
|---|---|---|
| *G03F 1/60* | (2012.01) | |
| *B32B 17/06* | (2006.01) | |
| *G03F 1/22* | (2012.01) | |
| *G03F 1/54* | (2012.01) | |
| *G03F 1/24* | (2012.01) | |
| *G03F 1/52* | (2012.01) | |

(52) U.S. Cl.
CPC ................ *G03F 1/60* (2013.01); *B32B 17/06* (2013.01); *G03F 1/22* (2013.01); *G03F 1/24* (2013.01); *G03F 1/52* (2013.01); *G03F 1/54* (2013.01); *B32B 2307/71* (2013.01)

(58) Field of Classification Search
CPC ..... G03F 1/22; G03F 1/24; G03F 1/52; G03F 1/54; G03F 1/60; B32B 17/06; B32B 2307/71
USPC ............................................................ 430/5
See application file for complete search history.

(56) References Cited

U.S. PATENT DOCUMENTS

| | | |
|---|---|---|
| 2011/0262846 A1 | 10/2011 | Tanabe |
| 2012/0208112 A1 | 8/2012 | Tanabe |

FOREIGN PATENT DOCUMENTS

| | | |
|---|---|---|
| WO | 2010/110139 | 9/2010 |

*Primary Examiner* — Christopher G Young
(74) *Attorney, Agent, or Firm* — Oblon, McClelland, Maier & Neustadt, L.L.P.

(57) ABSTRACT

A glass substrate for a mask blank includes a first surface and a second surface. The first surface and second surface face each other. Each of the first surface and the second surface is approximately square having a vertical length and a horizontal length being equal to the vertical length. The first surface of the glass substrate has specific profile properties.

14 Claims, 25 Drawing Sheets

GLASS SUBSTRATE FOR MASK BLANK, MASK BLANK AND PHOTOMASK

CROSS-REFERENCE TO RELATED APPLICATIONS

This application claims priority from Japanese Patent Application No. 2017-014710 filed on Jan. 30, 2017, the entire subject matter of which is incorporated herein by reference.

BACKGROUND OF THE INVENTION

Technical Field

The present invention relates to a glass substrate for a mask blank, a mask blank, and a photomask.

Background Art

Semiconductor manufacturing processes employ photolithography technologies using a photomask. In these technologies, the pattern of a photomask is transferred to a target substrate to be processed, by irradiating the photomask with exposing light using an exposing machine.

In recent years, to enable transfer of a very fine pattern, it has come to be studied to use short-wavelength exposing light such as ArF excimer laser light and even EUV (extreme ultraviolet) light.

The term "EUV light" means light that includes soft X rays and vacuum ultraviolet light and, more specifically, is approximately in a wavelength range of 0.2 nm to 100 nm. At present, use of EUV light having a wavelength of about 13.5 nm as exposing light is mainly being studied.

In photolithography technologies, the quality and accuracy of a transferred pattern are influenced by the flatness of the surface of a photomask. In particular, it is expected that the influence of the flatness of the surface of a photomask will become more remarkable as the degree of miniaturization of transfer patterns increases.

In the above circumstances, photomasks have come to be required be increased in flatness.
Patent document 1: WO 2010/110139 A1

SUMMARY OF THE INVENTION

Various surface polishing methods have been proposed so far to increase the flatness of a glass substrate for a mask blank (i.e. to control the flatness of the glass substrate to be low) from which a photomask is to be formed.

However, because of the above-described trend, it is expected that, in the near future, photomasks will be required to be extremely high in flatness (e.g., a height variation of 30 nm or less).

In such a flatness range, it is difficult to attain a target level of flatness only by polishing the surface of a glass substrate for a mask blank.

There is one approach for attaining such a high target level of flatness of a photomask making use of defamation that occurs when it is actually chucked and placed on a mask stage of an exposing machine. That is, it is considered that the target level of flatness should be achieved by combining realization of flatness in a prescribed range by polishing the surface of a glass substrate for a mask blank and an effect of chucking deformation of the photomask.

The present invention has been made in view of the above background, and an object of an aspect of the present invention is therefore to provide a glass substrate for a mask blank which can significantly improve the flatness of surface when a photomask is chucked and placed on a mask stage. Another object of an aspect of the present invention is to provide a mask blank using such a glass substrate and a photomask using such a glass substrate.

An aspect of the present invention provides a glass substrate for a mask blank, including a first surface and a second surface, which face each other and each of which is approximately square having a vertical length (P) and a horizontal length (P) being equal to the vertical length (P), wherein:

in the first surface, a first square having a center coinciding with a center of the first surface and sides which are parallel with respective sides of the first surface and have a length P1 of 104 mm, a second square having a center coinciding with the center of the first surface and sides which are parallel with the respective sides of the first surface and have a length P2 of 132 mm, and a third square having a center coinciding with the center of the first surface and sides which are parallel with the respective sides of the first surface and have a length P3 of 142 mm, are assumed;

a region inside the first square, the region including the first square, is referred to as a central region, a region enclosed by the second square and the first square, the region including the second square but not including the first square, is referred to as a peripheral region, a region enclosed by the third square and the second square, the region including the third square but not including the second square, is referred to as an edge region, a region inside the second square, the region including the second square, is referred to as a non-edge region, and a region inside the third square, the region including the third square, is referred to as an effective region;

in the effective region of the first surface, 100 or more vertical lines are drawn in the vertical direction at same interval d and 100 or more horizontal lines are drawn in the horizontal direction at same interval d, and a profile is recognized by measuring relative heights at respective measurement positions in a cross section taken along each of the vertical lines and the horizontal lines;

the profile of the first surface is judged as a convex profile if an average value of heights at measurement positions on all of the vertical lines and the horizontal lines in the central region is higher than an average value of heights at measurement positions on all of the vertical lines and the horizontal lines in the peripheral region, whereas the profile of the first surface is judged as a concave profile if the average value of heights at the measurement positions on all of the vertical lines and the horizontal lines in the central region is lower than the average value of heights at the measurement positions on all of the vertical lines and the horizontal lines in the peripheral region;

among the vertical lines, a vertical line that crosses, in the following order, the edge region which is referred to as a first section of the edge region, the peripheral region which is referred to as a first section of the peripheral region, the central region, the peripheral region which is referred to as a second section of the peripheral region, and the edge region which is referred to as a second section of the edge region, is referred to as a particular vertical line;

among the horizontal lines, a horizontal line that crosses, in the following order, the edge region which is referred to as a third section of the edge region, the peripheral region which is referred to as a third section of the peripheral region, the central region, the peripheral region which is referred to as a fourth section of the peripheral region, and the edge region which is referred to as a fourth section of the edge region, is referred to as a particular horizontal line;

a peak-to-valley (PV) value in the effective region is 70 nm or less;

(i) in a case where the profile of the first surface is the convex profile, when a profile curve is drawn by a curve fitting based on each measurement point in the non-edge region in a profile in a cross section taken along each of the particular vertical line and the particular horizontal line, an extrapolation curve having a first portion $\phi_1$ in the first section or third section of the edge region and a second portion $\phi_2$ in the second section or fourth section of the edge region is drawn by extrapolating the profile curve to the ends of the effective region, and a first reference curve $R_1$ and a second reference curve $R_2$ are drawn by adding 3 nm to heights of the first portion $\phi_1$ and the second portion $\phi_2$, respectively, a mode which a first straight line obtained by straight-line-approximating measurement points of the profile in the first section or third section of the edge region is located under the first reference curve $R_1$ and a second straight line obtained by straight-line-approximating measurement points of the profile in the second section or fourth section of the edge region is located under the second reference curve $R_2$ holds in 75% or more of the cross sections taken along all of the particular vertical lines and the particular horizontal lines; and (ii) in a case where the profile of the first surface is the concave profile, when a profile curve is drawn by a curve fitting based on each measurement point in the non-edge region in a profile in a cross section taken along each of the particular vertical lines and the particular horizontal lines, an extrapolation curve having a first portion $\phi_1$ in the first section or third section of the edge region and a second portion $\phi_2$ in the second section or fourth section of the edge region is drawn by extrapolating the profile curve to the ends of the effective region, and a first reference curve $R_1$ and a second reference curve $R_2$ are drawn by subtracting 3 nm from heights of the first portion $\phi_1$ and the second portion $\phi_2$, respectively, a mode which a first straight line obtained by straight-line-approximating measurement points of the profile in the first section or third section of the edge region is located over the first reference curve $R_1$ and a second straight line obtained by straight-line-approximating measurement points of the profile in the second section or fourth section of the edge region is located over the second reference curve $R_2$ holds in 75% or more of the cross sections taken along all of the particular vertical lines and the particular horizontal lines.

In addition, an aspect of the present invention provides a mask blank including:

a glass substrate; and a film formed on a surface of the glass substrate, wherein:

the glass substrate comprises a first surface and a second surface, which face each other and each of which is approximately square having a vertical length (P) and a horizontal length (P) being equal to the vertical length (P);

in the first surface, a first square having a center coinciding with a center of the first surface and sides which are parallel with respective sides of the first surface and have a length P1 of 104 mm, a second square having a center coinciding with the center of the first surface and sides which are parallel with the respective sides of the first surface and have a length P2 of 132 mm, and a third square having a center coinciding with the center of the first surface and sides which are parallel with the respective sides of the first surface and have a length P3 of 142 mm, are assumed;

a region inside the first square, the region including the first square, is referred to as a central region, a region enclosed by the second square and the first square, the region including the second square but not including the first square, is referred to as a peripheral region, a region enclosed by the third square and the second square, the region including the third square but not including the second square, is referred to as an edge region, a region inside the second square, the region including the second square, is referred to as a non-edge region, and a region inside the third square, the region including the third square, is referred to as an effective region;

in the effective region of the first surface, 100 or more vertical lines are drawn in the vertical direction at same interval d and 100 or more horizontal lines are drawn in the horizontal direction at same interval d, and a profile is recognized by measuring relative heights at respective measurement positions in a cross section taken along each of the vertical lines and the horizontal lines;

the profile of the first surface is judged as a convex profile if an average value of heights at measurement positions on all of the vertical lines and the horizontal lines in the central region is higher than an average value of heights at measurement positions on all of the vertical lines and the horizontal lines in the peripheral region, whereas the profile of the first surface is judged as a concave profile if the average value of heights at the measurement positions on all of the vertical lines and the horizontal lines in the central region is lower than the average value of heights at the measurement positions on all of the vertical lines and the horizontal lines in the peripheral region;

among the vertical lines, a vertical line that crosses, in the following order, the edge region which is referred to as a first section of the edge region, the peripheral region which is referred to as a first section of the peripheral region, the central region, the peripheral region which is referred to as a second section of the peripheral region, and the edge region which is referred to as a second section of the edge region, is referred to as a particular vertical line;

among the horizontal lines, a horizontal line that crosses, in the following order, the edge region which is referred to as a third section of the edge region, the peripheral region which is referred to as a third section of the peripheral region, the central region, the peripheral region which is referred to as a fourth section of the peripheral region, and the edge region which is referred to as a fourth section of the edge region, is referred to as a particular horizontal line;

a peak-to-valley (PV) value in the effective region is 70 nm or less;

(i) in a case where the profile of the first surface is the convex profile, when a profile curve is drawn by a curve fitting based on each measurement point in the non-edge region in a profile in a cross section taken along each of the particular vertical line and the particular horizontal line, an extrapolation curve having a first portion $\phi_1$ in the first section or third section of the edge region and a second portion $\phi_2$ in the second section or fourth section of the edge region is drawn by extrapolating the profile curve to the ends of the effective region, and a first reference curve $R_1$ and a second reference curve $R_2$ are drawn by adding 3 nm to heights of the first portion $\phi_1$ and the second portion $\phi_2$, respectively, a mode which a first straight line obtained by straight-line-approximating measurement points of the profile in the first section or third section of the edge region is located under the first reference curve $R_1$ and a second straight line obtained by straight-line-approximating measurement points of the profile in the second section or fourth section of the edge region is located under the second reference curve $R_2$ holds in 75% or more of the cross sections taken along all of the particular vertical lines and the particular horizontal lines; and (ii) in a case where the profile of the first surface is the concave profile, when a profile curve is drawn by a curve fitting based on each measurement point in the non-edge region in a profile in a cross section taken along each of the particular vertical lines and the particular horizontal lines, an extrapolation curve having a first portion $\phi_1$ in the first section or third section of the edge region and a second portion $\phi_2$ in the second section or fourth section of the edge region is drawn by extrapolating the profile curve to the ends of the effective region, and a first reference curve $R_1$ and a second reference curve $R_2$ are drawn by subtracting 3 nm from heights of the first portion $\phi_1$ and the second portion $\phi_2$, respectively, a mode which a first straight line obtained by straight-line-approximating measurement points of the profile in the first section or third section of the edge region is located over the first reference curve $R_1$ and a second straight line obtained by straight-line-approximating measurement points of the profile in the second section or fourth section of the edge region is located over the second reference curve $R_2$ holds in 75% or more of the cross sections taken along all of the particular vertical lines and the particular horizontal lines.

In addition, an aspect of the present invention provides a photomask including:

a glass substrate; and a patterned film formed on a surface of the glass substrate, wherein:

the glass substrate comprises a first surface and a second surface, which face each other and each of which is approximately square having a vertical length (P) and a horizontal length (P) being equal to the vertical length (P);

in the first surface, a first square having a center coinciding with a center of the first surface and sides which are parallel with respective sides of the first surface and have a length P1 of 104 mm, a second square having a center coinciding with the center of the first surface and sides which are parallel with the respective sides of the first surface and have a length P2 of 132 mm, and a third square having a center coinciding with the center of the first surface and sides which are parallel with the respective sides of the first surface and have a length P3 of 142 mm, are assumed;

a region inside the first square, the region including the first square, is referred to as a central region, a region enclosed by the second square and the first square, the region including the second square but not including the first square, is referred to as a peripheral region, a region enclosed by the third square and the second square, the region including the third square but not including the second square, is referred to as an edge region, a region inside the second square, the region including the second square, is referred to as a non-edge region, and a region inside the third square, the region including the third square, is referred to as an effective region;

in the effective region of the first surface, 100 or more vertical lines are drawn in the vertical direction at same interval d and 100 or more horizontal lines are drawn in the horizontal direction at same interval d, and a profile is recognized by measuring relative heights at respective measurement positions in a cross section taken along each of the vertical lines and the horizontal lines;

the profile of the first surface is judged as a convex profile if an average value of heights at measurement positions on all of the vertical lines and the horizontal lines in the central region is higher than an average value of heights at measurement positions on all of the vertical lines and the horizontal lines in the peripheral region, whereas the profile of the first surface is judged as a concave profile if the average value of heights at the measurement positions on all of the vertical lines and the horizontal lines in the central region is lower than the average value of heights at the measurement positions on all of the vertical lines and the horizontal lines in the peripheral region;

among the vertical lines, a vertical line that crosses, in the following order, the edge region which is referred to as a first section of the edge region, the peripheral region which is referred to as a first section of the peripheral region, the central region, the peripheral region which is referred to as a second section of the peripheral region, and the edge region which is referred to as a second section of the edge region, is referred to as a particular vertical line;

among the horizontal lines, a horizontal line that crosses, in the following order, the edge region which is referred to as a third section of the edge region, the peripheral region which is referred to as a third section of the peripheral region, the central region, the peripheral region which is referred to as a fourth section of the peripheral region, and the edge region which is referred to as a fourth section of the edge region, is referred to as a particular horizontal line;

a peak-to-valley (PV) value in the effective region is 70 nm or less;

(i) in a case where the profile of the first surface is the convex profile, when a profile curve is drawn by a curve fitting based on each measurement point in the non-edge region in a profile in a cross section taken along each of the particular vertical line and the particular horizontal line, an extrapolation curve having a first portion $\phi_1$ in the first section or third section of the edge region and a second portion $\phi_2$ in the second section or fourth section of the edge region is drawn by extrapolating the profile curve to the ends of the effective region, and a first reference curve $R_1$ and a second reference curve $R_2$ are drawn by adding 3 nm to heights of the first portion $\phi_1$ and the second portion $\phi_2$, respectively, a mode which a first straight line obtained by straight-line-approximating measurement points of the profile in the first section or third section of the edge region is located under the first reference curve $R_1$ and a second straight line obtained by straight-line-approximating measurement points of the profile in the second section or fourth section of the edge region is located under the second reference curve $R_2$ holds in 75% or more of the cross sections taken along all of the particular vertical lines and the particular horizontal lines; and (ii) in a case where the profile of the first surface is the concave profile, when a profile curve is drawn by a curve fitting based on each measurement point in the non-edge region in a profile in a cross section taken along each of the particular vertical lines and the particular horizontal lines, an extrapolation curve having a first portion $\phi_1$ in the first section or third section of the edge region and a second portion $\phi_2$ in the second section or fourth section of the edge region is drawn by extrapolating the profile curve to the ends of the effective region, and a first reference curve $R_1$ and a second reference curve $R_2$ are drawn by subtracting 3 nm from heights of the first portion $\phi_1$ and the second portion $\phi_2$, respectively, a mode which a first straight line obtained by straight-line-approximating measurement points of the profile in the first section or third section of the edge region is located over the first reference curve $R_1$ and a second straight line obtained by straight-line-approximating measurement points of the profile in the second section or fourth section of the edge region is located over the second reference curve $R_2$ holds in 75% or more of the cross sections taken along all of the particular vertical lines and the particular horizontal lines.

The present invention can provide a glass substrate for a mask blank the flatness of whose surface can be significantly improved when a photomask is chucked and placed on a mask stage. The present invention can also provide a mask blank using such a glass substrate and a photomask using such a glass substrate.

DETAILED DESCRIPTION OF THE INVENTION

Embodiments of the present invention will be hereinafter described with reference to the drawings.

(Glass Substrate for Mask Blank According to an Embodiment of the Present Invention)

Figure 1:
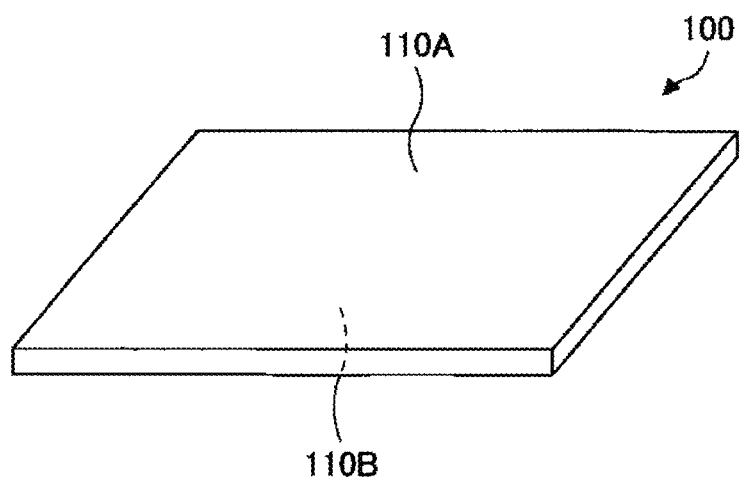
FIG. 1 is a schematic perspective view of an example of a glass substrate for a mask blank according to an embodiment of the present invention.

FIG. 1 is a perspective view of a glass substrate (hereinafter referred to as a "first glass substrate") 100 for a mask blank according to an embodiment of the present invention.

As shown in FIG. 1, the first glass substrate 100 has a first surface 110A and a second surface 110B, which face each other. The first glass substrate 100 is approximately shaped like a square in a plan view, and hence the first surface 110A and the second surface 110B are also approximately shaped like a square. The term "approximately shaped like a square" includes a case that at least one of the four corners is rounded.

Before describing the features of the first glass substrate 100, the names of individual regions of the first glass substrate 100 will be described with reference to FIG. 2.

Figure 2:
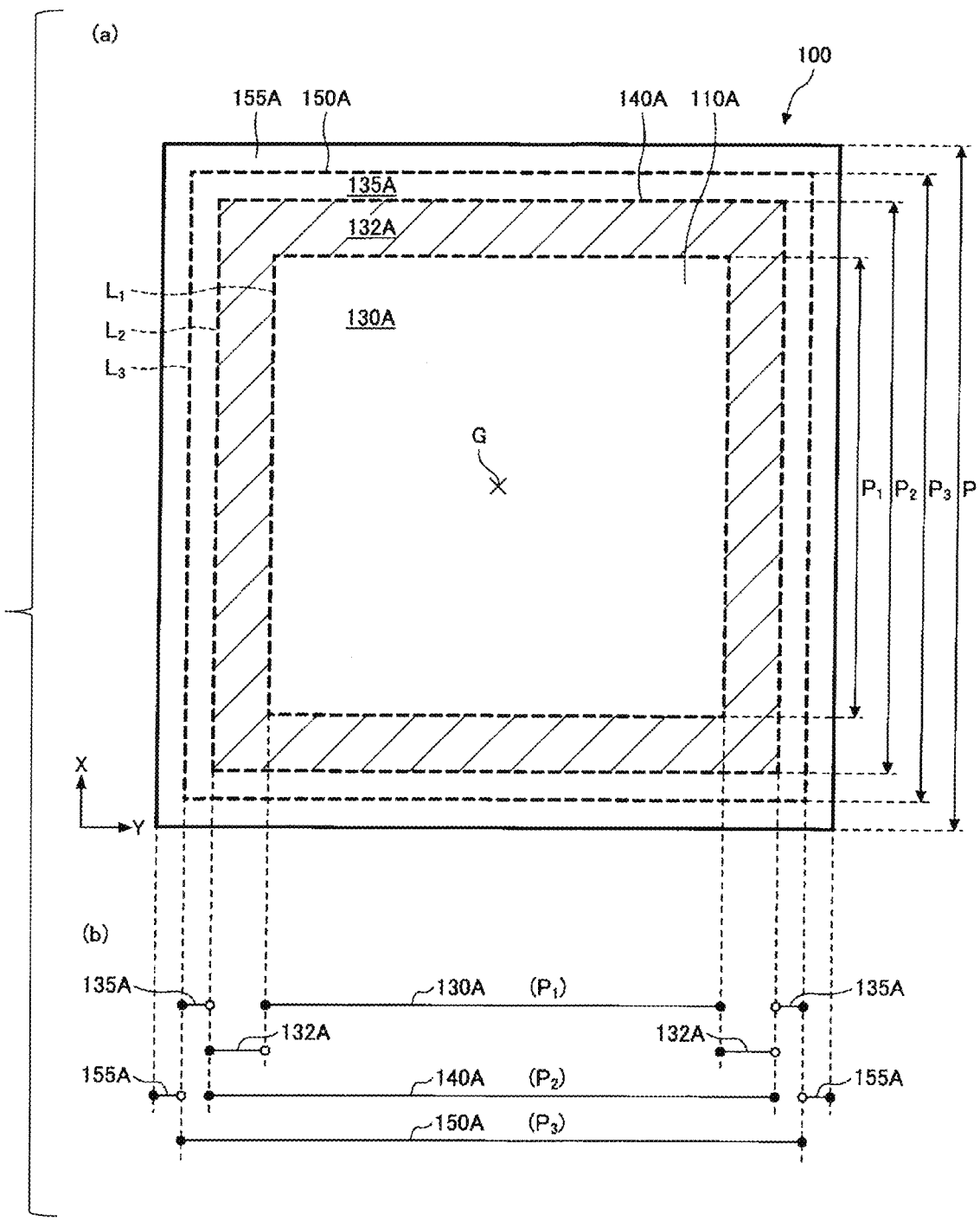
FIG. 2 shows individual regions of a first surface of the glass substrate according to an embodiment of the present invention; the diagram (a) of FIG. 2 is a top view of the first surface of the glass substrate according to an embodiment of the present invention, and the diagram (b) of FIG. 2 schematically shows ranges, in the Y direction, of the respective regions of the first surface of the glass substrate shown in the diagram (a) of FIG. 2.

The diagram (a) of FIG. 2 is a top view of the first surface 110A of the first glass substrate 100. The diagram (b) of FIG. 2 schematically shows ranges, in the Y direction, of the respective regions of the first surface 110A of the first glass substrate 100.

As shown in the diagram (a) of FIG. 2, the first surface 110A of the first glass substrate 100 is approximately shaped like a square whose lengths P in the vertical direction (X direction) and the horizontal direction (Y direction) are equal to 152 mm. As mentioned above, at least one of the four corners of the first surface 110A may be rounded.

The first surface 110A is largely divided into four regions 130A, 132A, 135A, and 155A by three square frames (indicated by broken lines) $L_1$ to $L_3$ whose centers coincide with the center G (the intersection point of the diagonals) of the first surface 110A.

More specifically, the frame $L_1$ is a square frame whose sides have a length $P_1$, and the region enclosed by the frame $L_1$ (the frame $L_1$ itself is included) is referred to as a "central region" 130A of the first surface 110A. The frame $L_2$ is a square frame whose sides have a length $P_2$, and the hatched region enclosed by the frames $L_1$ and $L_2$ (the frame $L_2$ itself is included but the frame $L_1$ itself is not included) is referred to as a "peripheral region" 132A. The frame $L_3$ is a square frame whose sides have a length $P_3$, and the region enclosed by the frames $L_2$ and $L_3$ (the frame $L_3$ itself is included but the frame $L_2$ itself is not included) is referred to as an "edge region" 135A. The region inside the frame $L_2$ (the frame $L_2$ itself is included) is called a "non-edge region" 140A, and the region inside the frame $L_3$ (the frame $L_3$ itself is included) is called an "effective region" 150A. The region outside the frame $L_3$ is called an "ineffective region" 155A.

The diagram (b) of FIG. 2 schematically shows, in a one-dimensional manner, positional relationships between the regions shown in the diagram (a) of FIG. 2.

The lengths $P_1$, $P_2$, and $P_3$ are equal to 104 mm, 132 mm, and 142 mm, respectively.

It is noted that the frames $L_1$ to $L_3$ are just drawn for convenience of description and actually do not exist on the first surface 110A of the first glass substrate 100.

Although the names of the regions of the first surface 110A of the first glass substrate 100 have been described above with reference to FIG. 2, the same names are given to corresponding regions, obtained by the same manner of division, of the second surface 110B of the first glass substrate 100. However, in this specification, to avoid confusion between the regions of the first surface 110A and those of the second surface 110B, the regions of the second surface 110B are given reference symbols having a suffix "B" instead of "A." Thus, for example, the central region, the peripheral region, the edge region, the non-edge region, the effective region, and the ineffective region of the second surface 110B of the first glass substrate 100 are given by reference symbols 130B, 132B, 135B, 140B, 150B, and 155B, respectively.

Next, the features of the first glass substrate 100 will be described with reference to FIG. 3.

Figure 3:
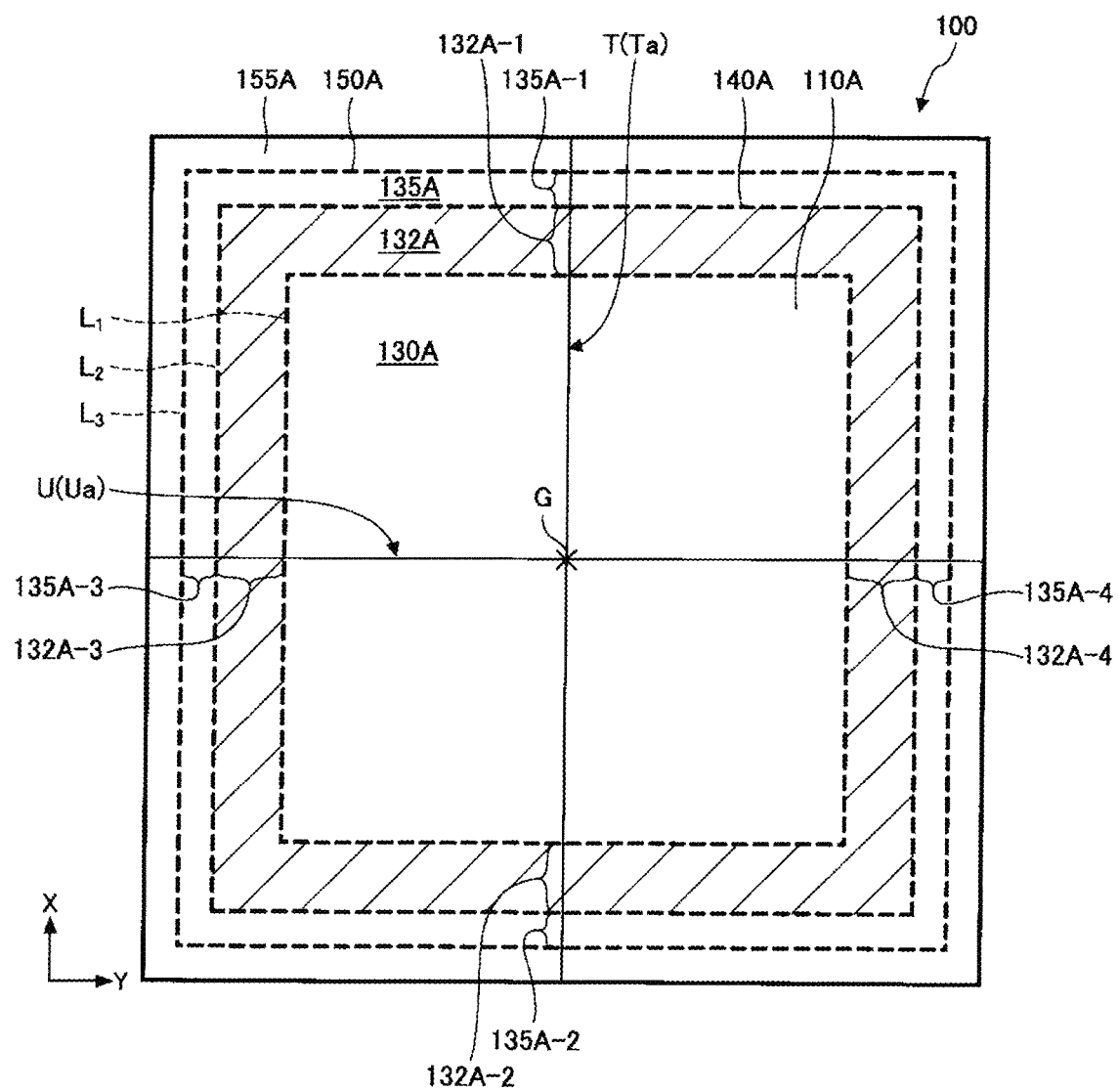
FIG. 3 is a top view of the first surface of the glass substrate according to an embodiment of the present invention.

FIG. 3 is also a top view of the first surface 110A of the first glass substrate 100.

The following manipulations are made as a preparation for understanding of the features of the first glass substrate 100.

First, in the effective region 150A of the first surface 100A, 100 or more vertical lines T are drawn at the same interval d in the vertical direction (X direction) and 100 or more horizontal lines U are drawn at the same interval d in the horizontal direction (Y direction). The number of vertical lines T and the number of the horizontal lines U are identical and are set at 100, 124, 200, 218, 256, or the like.

As one example, one vertical line T and one horizontal line U, each of which passes through the center G of the first surface 110A, are shown in FIG. 3. Each of the vertical line T and horizontal line U is not always necessary to pass through the center G.

Among the vertical lines T, ones that pass through the edge region 135A, the peripheral region 132A, the central region 130A, the peripheral region 132A, and the edge region 135A in this order are referred to as particular vertical lines Ta. According to this definition, the vertical line T shown in FIG. 3 is a particular vertical line Ta.

Those portions of the edge region 135A and the peripheral region 132A, through which the particular vertical lines Ta pass, are referred to in order as a "first section 135A-1 of the edge region," a "first section 132A-1 of the peripheral region," a "second section 132A-2 of the peripheral region," and a "second section 135A-2 of the edge region."

In the example of FIG. 3, in the particular vertical line Ta, the top portion of the edge region 135A is called the first section 135A-1 of the edge region and the bottom portion of the edge region 135A is called the second section 135A-2 of the edge region. In addition, in the particular vertical line Ta, the top portion of the peripheral region 132A is called the first section 132A-1 of the peripheral region and the bottom portion of the peripheral region 132A is called the second section 132A-2 of the peripheral region. This name assignment is for convenience and the terms "first section" and "second section" may be interchanged.

However, the first section 135A-1 of the edge region and first section 132A-1 of the peripheral region need to be located on the same side of the central region 130A.

Likewise, among the horizontal lines U, ones that pass through the edge region 135A, the peripheral region 132A, the central region 130A, the peripheral region 132A, and the edge region 135A in this order are referred to as particular horizontal lines Ua. According to this definition, the horizontal line $L_1$ shown in FIG. 3 is a particular horizontal line Ua.

Those portions of the edge region 135A and the peripheral region 132A, through which the particular horizontal lines Ua pass, are referred to in order as a "third section 135A-3 of the edge region," a "third section 132A-3 of the peripheral region," a "fourth section 132A-4 of the peripheral region," and a "fourth section 135A-4 of the edge region."

As in the case of the particular vertical lines Ta, the third section 135A-3 of the edge region 135A and third section 132A-3 of the peripheral region 132A need to be located on the same side of the central region 130A. The same is applied for the fourth section 135A-4 of the edge region 135A and fourth section 132A-4 of the peripheral region 132A.

Relative heights of individual positions in the cross section taken along each of the straight lines T and U are measured and ridge line profiles of the first surface 110A in the respective cross sections are recognized. A height difference between a maximum height and a minimum height among the heights measured at measurement positions on all of straight lines T and U passing through the effective region 150A of the first surface 110A is referred to as a "peak-to-valley (PV) value."

Figure 4:
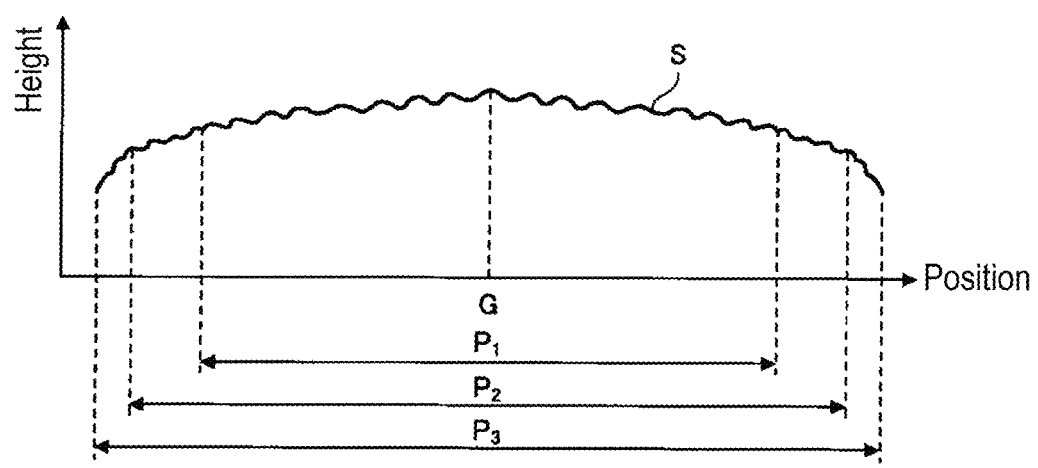
FIG. 4 schematically shows a ridge line profile of the first surface in a cross section taken along one particular horizontal line.

FIG. 4 shows a ridge line profile S of the first surface 110A in a cross section taken along one particular horizontal line Ua. Although in actuality the ridge line profile S is a set of plots at the respective measurement positions, in FIG. 4 the ridge line profile S is drawn as a schematic curve for the sake of clarification.

Subsequently, an average height (called a central average height $H_{ave130}$) is calculated by averaging the heights measured at measurement positions on all of straight lines T and U in the central region 130A (the range $P_1$ in FIG. 4). Likewise, an average height (called a peripheral average height $H_{ave132}$) is calculated by averaging the heights measured at measurement positions on all of straight lines T and U in the peripheral region 132A (the range included in the range $P_2$ but not included in the range $P_1$ in FIG. 4).

If the central average height $H_{ave130}$ and the peripheral average height $H_{ave132}$ satisfy a relationship $H_{ave130} H_{ave132}$, the first surface 110A is judged to be a convex profile. On the other hand, they satisfy a relationship $H_{ave130} < H_{ave132}$, the first surface 110A is judged to be a concave profile.

The features of the first glass substrate 100 will be described below for each of the cases of the convex profile and the concave profile.

(Case of Convex Profile)

In this case, a fitting curve F is determined by a curve fitting based on each point, included in the non-edge region 140A, of the ridge line profile S of the first surface 110A in the cross section taken along each particular vertical lines Ta or particular horizontal lines Ua.

It is preferable that in the curve fitting a fitting curve F be determined by a least-squares method using a second or higher-order polynomial. However, when a second-order polynomial is used, there may occur a case that the fitting accuracy is not very high. In particular, there may occur a case that shapes in an outside portion of the non-edge region 140A (i.e., a portion, adjoining the edge region 135A, of the non-edge region 140A) cannot be reproduced properly with a second-order polynomial. In such a case, a fourth or higher-order polynomial may be used. Even a sixth or higher-order polynomial may be used. However, with a sixth or higher-order polynomial, the fitting accuracy may not be improved much for increase in the amount of calculation for the curve fitting. Thus, it is preferable to perform curve fitting using a fourth-order polynomial.

In this specification, the following description of embodiments, Examples, and Comparative Examples will be directed to the case where the curve fitting is performed using a fourth-order polynomial.

Figure 5:
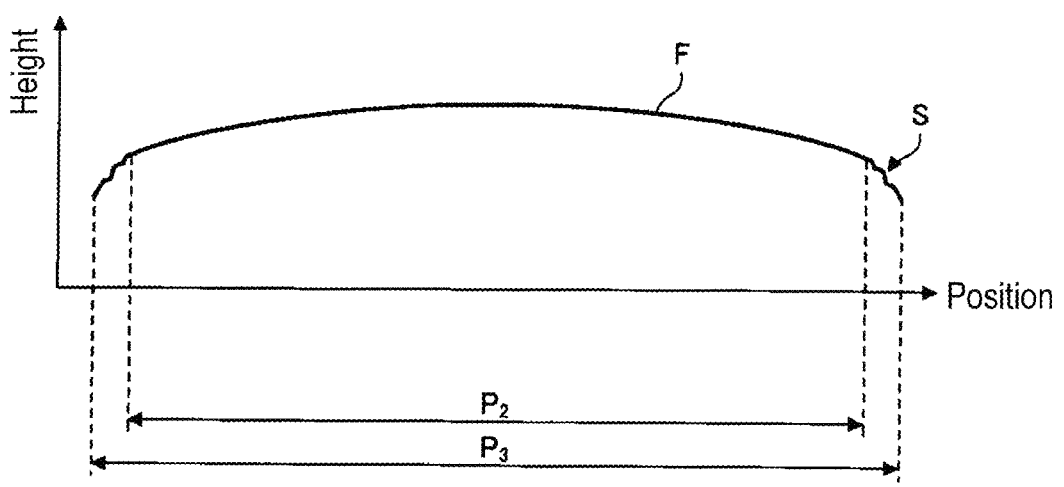
FIG. 5 shows an example of a fitting curve that is obtained by a curve fitting based on each point, included in a non-edge region, of the ridge line profile shown in FIG. 4.

FIG. 5 shows an example of a fitting curve F that is obtained by a curve fitting based on each point, included in the non-edge region 140A, of the ridge line profile S of the one particular horizontal line Ua shown in FIG. 4. In FIG. 5, for the sake of clarification, the portion of the ridge line profile S which corresponds to the non-edge region 140A is omitted.

As shown in FIG. 5, the fitting curve F is obtained by a curve fitting based on each point, in the range $P_2$ (non-edge region 140A), measured along the one particular horizontal line Ua.

Subsequently, extrapolation curves φ are obtained by extrapolating the fitting curves F that have been obtained by the above manipulations to the ends of the effective region 150A. As a result, a first portion $φ_1$ of each extrapolation curve φ is drawn in the first section 135A-1 or third section 135A-3 of the edge region so as to be connected to the one end of the fitting curve F. Likewise, a second portion $φ_2$ of the extrapolation curve φ is drawn in the second section 135A-2 or fourth section 135A-4 of the edge region so as to be connected to the other end of the fitting curve F.

Figure 6:
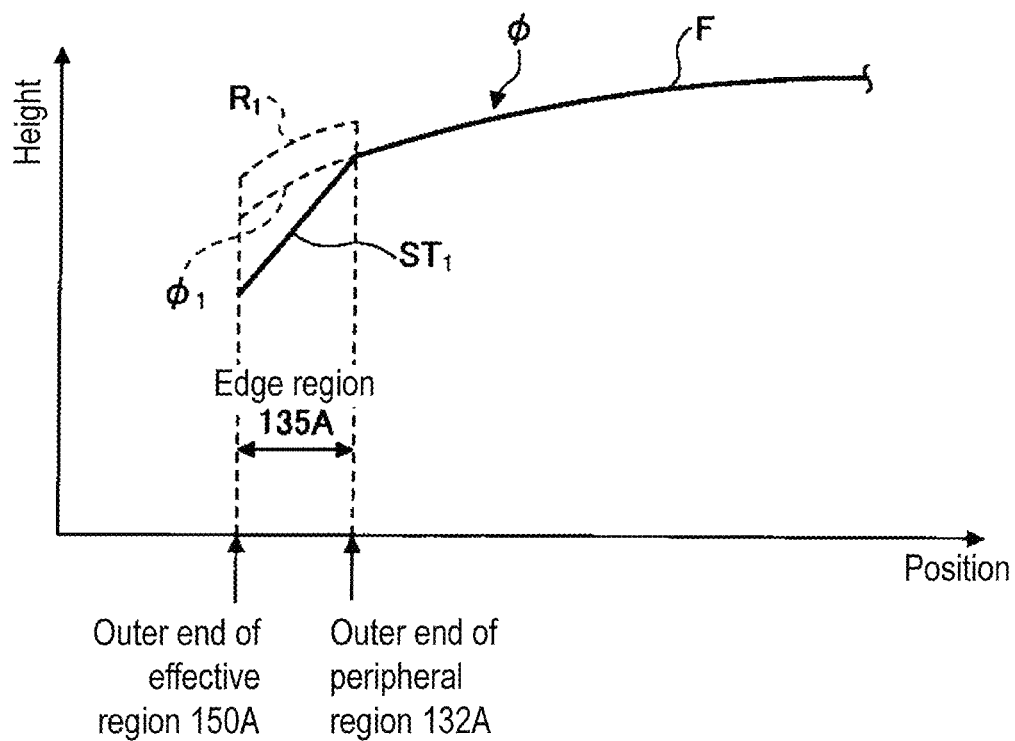
FIG. 6 illustrates how a first portion of an extrapolation curve is obtained by extrapolating the fitting curve shown in FIG. 5.

FIG. 6 illustrates how the extrapolation curve φ is drawn by extrapolating the fitting curve F shown in FIG. 5 to the end of the effective region 150A. As a result of this manipulation, the first portion $φ_1$ of the extrapolation curve φ is obtained outside the one end of the fitting curve F. Although only part (i.e., the portion located on the left of the fitting curve F shown in FIG. 5) of the extrapolation curve φ is shown in FIG. 6, in actual, the second portion $φ_2$ of the extrapolation curve φ is also drawn on the right of the fitting curve F shown in FIG. 5 by a similar manipulation.

Then, a first reference curve $R_1$ is determined by adding 3 nm to the height values at the respective positions of each first portion $\phi_1$.

The reason for adding 3 nm is to take influence of flatness measurement errors into consideration. In general, interferometers are used for measuring flatness of a surface. And even high-accuracy interferometers usually have a measurement error of ±3 nm. In view of this, in the embodiment, 3 nm is added to the height values taking into consideration influence of a variation of the measurement values of a measuring instrument.

FIG. 6 also shows such a first reference curve $R_1$ in addition to the first portion $\phi_1$ of the extrapolation curve $\phi$.

A second reference curve $R_2$ (not shown) is determined for the second portion $\phi_2$ of each extrapolation curve $\phi$ by similar manner.

Subsequently, a first straight line $ST_1$ is determined by performing straight line approximation of a least squares method on the points, included in the position of the first portion $\phi_1$ of the extrapolation curve $\phi$, that is, the first section 135A-1 or third section 135A-3 of the edge region 135A, of each ridge line profile S in the edge region.

Likewise, a second straight line $ST_2$ is determined by performing straight line approximation of the least squares method on the points, included in the position of the second portion $\phi_2$ of the extrapolation curve $\phi$, that is, the second section 135A-2 or fourth section 135A-4 of the edge region 135A, of each ridge line profile S in the edge region.

FIG. 6 also shows a first straight line $ST_1$ obtained by performing straight line approximation on the points, included in the first section 135A-1 of the edge region 135A, of the ridge line profile S shown in FIG. 4.

Subsequently, a positional relationship between the first straight line $ST_1$ and the first reference curve $R_1$ and a positional relationship between the second straight line $ST_2$ and the second reference curve $R_2$ in the cross section taken along each particular vertical line Ta or Ua are recognized. For example, in FIG. 6, it is recognized that the first straight line $ST_1$ is located under the first reference curve $R_1$.

The above-described manipulations are performed on all of the particular vertical lines Ta and the particular horizontal lines Ua.

The above evaluation reveals that, in the first glass substrate 100, a mode which the first straight line $ST_1$ is located under the first reference curve $R_1$ and the second straight line $ST_2$ is located under the second reference curve $R_2$ occurs in 75% or more of the cross sections taken along all of the particular vertical lines Ta and the particular horizontal lines Ua.

(Case of Concave Profile)

Also in this case, a fitting curve F is determined by a curve fitting based on each point, included in the non-edge region 140A, of the ridge line profile S of the first surface 110A in the cross section taken along each particular vertical lines Ta or particular horizontal lines Ua.

Figure 7:
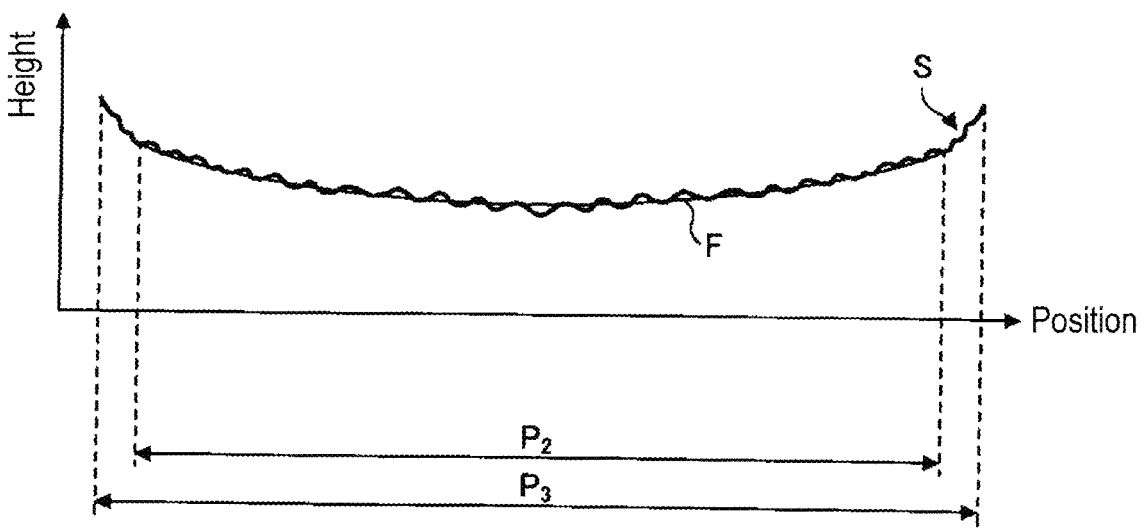
FIG. 7 shows an example of a fitting curve that is obtained by a curve fitting based on each point, included in the non-edge region, of a ridge line profile of one particular horizontal line.

FIG. 7 shows an example of a fitting curve F that is obtained by a curve fitting based on each point in the position which corresponds to the non-edge region 140A, included in the non-edge region 140A, of a ridge line profile S of one particular horizontal line Ua.

Subsequently, extrapolation curves $\phi$ are obtained by extrapolating the fitting curves F that have been obtained by the above manipulations to the ends of the effective region 150A. As a result, a first portion $\phi_1$ of each extrapolation curve $\phi$ is drawn in the first section 135A-1 or third section 135A-3 of the edge region 135A so as to be connected to one end of the fitting curve F. Likewise, a second portion $\phi_2$ of the extrapolation curve $\phi$ is drawn in the second section 135A-2 or fourth section 135A-4 of the edge region 135A so as to be connected to the other end of the fitting curve F.

Figure 8:
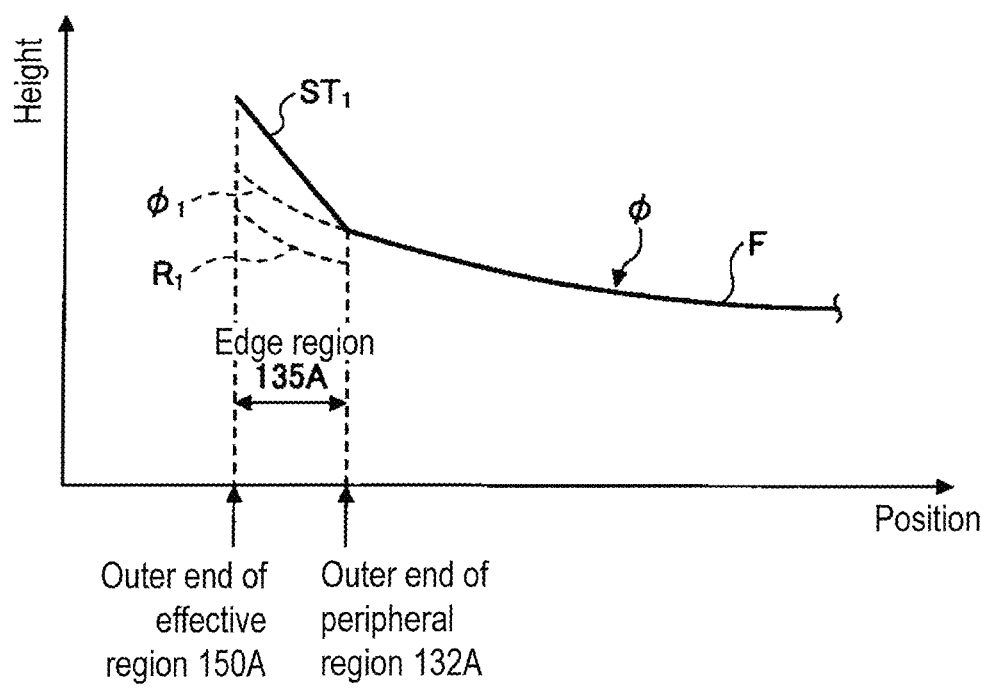
FIG. 8 illustrates how a first portion of an extrapolation curve is obtained by extrapolating the fitting curve shown in FIG. 7.

FIG. 8 illustrates how the extrapolation curve $\phi$ is drawn by extrapolating the fitting curve F shown in FIG. 7 to the end of the effective region 150A. As a result of this manipulation, the first portion $\phi_1$ of the extrapolation curve $\phi$ is obtained outside the one end of the fitting curve F. Although only part (i.e., the portion located on the left of the fitting curve F shown in FIG. 7) of the extrapolation curve $\phi$ is shown in FIG. 8, in actual, the second portion $\phi_2$ of the extrapolation curve $\phi$ is also drawn on the right of the fitting curve F shown in FIG. 7 by a similar manipulation.

Then, a first reference curve $R_1$ is determined by subtracting 3 nm from the height values at the respective positions of each first portion $\phi_1$. As mentioned above, the reason for subtracting 3 nm is to take influence of flatness measurement errors into consideration.

FIG. 8 also shows such a first reference curve $R_1$ in addition to the first portion $\phi_1$ of the extrapolation curve $\phi$.

A second reference curve $R_2$ (not shown) is determined for the second portion $\phi_2$ of each extrapolation curve $\phi$ by similar manner.

Subsequently, a first straight line $ST_1$ is determined by performing straight line approximation of a least squares method on the points, included in the position of the first portion $\phi_1$ of the extrapolation curve $\phi$, that is, the first section 135A-1 or third section 135A-3 of the edge region 135A, of each ridge line profile S in the edge region.

Likewise, a second straight line $ST_2$ is determined by performing straight line approximation of the least squares method on the points, included in the position of the second portion $\phi_2$ of the extrapolation curve $\phi$, that is, the second section 135A-2 or fourth section 135A-4 of the edge region 135A, of each ridge line profile S in the edge region.

FIG. 8 also shows a first straight line $ST_1$ obtained by performing straight line approximation on the points, included in the first section 135A-1 of the edge region 135A, of the ridge line profile S shown in FIG. 7.

Subsequently, a positional relationship between the first straight line $ST_1$ and the first reference curve $R_1$ and a positional relationship between the second straight line $ST_2$ and the second reference curve $R_2$ in the cross section taken along each particular vertical line Ta or Ua are recognized. For example, in FIG. 8, it is recognized that the first straight line $ST_1$ is located over the first reference curve $R_1$.

The above-described manipulations are performed on all of the particular vertical lines Ta and the particular horizontal lines Ua.

The above evaluation reveals that, in the first glass substrate 100, a mode which the first straight line $ST_1$ is located over the first reference curve $R_1$ and the second straight line $ST_2$ is located over the second reference curve $R_2$ occurs in 75% or more of the cross sections taken along all of the particular vertical lines Ta and the particular horizontal lines Ua.

The first glass substrate 100 also has a feature that the above-mentioned PV value is 70 nm or less irrespective of whether the first surface 110A has a convex profile or a concave profile.

That is, the first glass substrate 100 is such that its PV value in the effective region 150A is suppressed to 70 nm or less and has a convex profile or a concave profile (described above).

When a photomask formed using the above-described first glass substrate 100 is chucked and placed on a mask stage of an exposing machine, the flatness of the photomask can be significantly improved by a synergy effect of high flatness of the photomask itself and deformation that is caused by the chucking. For example, high flatness such as 30 nm can be attained in the first surface of the photomask.

As such, the first glass substrate 100 can be used suitably for what is called a transmission photomask that is used for executing a photolithography process on a semiconductor substrate using exposing light transmitted through the first glass substrate 100.

To stably manufacture glass substrates having surface PV values of 0.5 μm or less, a local polishing process that uses a local processing tool that is smaller than the area of the first surface of each glass substrate may be added between polishing processes that use an ordinary double-sided polishing machine. Examples of the local polishing method include ordinary methods using plasma etching, a gas cluster ion beam, or magnetic fluid polishing and a small rotary tool. During the local polishing process, the local processing tool scans the entire first surface of a glass substrate under the same polishing conditions in prescribed directions at a stage speed that is calculated on the basis of a substrate shape and a polishing rate of the local processing tool. However, it is difficult to manufacture the first glass substrate 100 having the above-described features merely by using such a local polishing method.

Thus, the first glass substrate 100 is manufactured by using a special local polishing method. More specifically, in this local polishing method, the polishing conditions of a local polishing tool are changed depending on the case of scanning the edge region 135A of the first surface 110A or the case of scanning the central region 130A. In particular, different polishing conditions are set independently for the four respective sides of the edge region 135A. This measure makes it possible to manufacture the first glass substrate 100 having the above-described features.

(Glass Substrate for Mask Blank According to an Embodiment of the Present Invention Next, another glass substrate 200 for a mask blank according to an embodiment of the present invention will be described.

Figure 9:
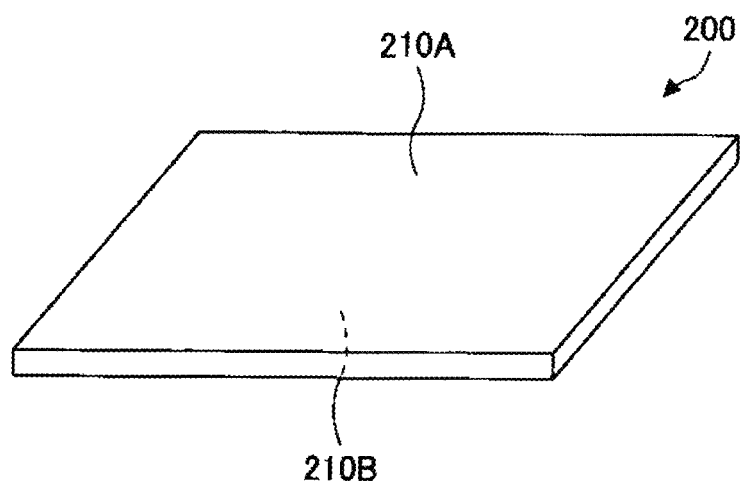
FIG. 9 is a schematic perspective view showing a glass substrate (second glass substrate) for a mask blank according to another embodiment of the present invention.

FIG. 9 is a perspective view of the glass substrate (hereinafter referred to as a "second glass substrate") 200 for a mask blank according to an embodiment of the present invention.

As shown in FIG. 9, the second glass substrate 200 has a first surface 210A and a second surface 210B, which face each other. The second glass substrate 200 is approximately shaped like a square in a plan view, and hence the first surface 210A and the second surface 210B are also approximately shaped like a square. At least one of the four corners of each of the first surface 210A and the second surface 210B may be rounded.

The vertical and horizontal lengths P of each of the first surface 210A and the second surface 210B are equal to 152 mm.

The first surface 210A of the second glass substrate 200 has the same features as the first surface 110A of the first glass substrate 100.

That is, the first surface 210A of the second glass substrate 200 has the feature that the PV value in the effective region is 70 nm or less.

Furthermore, the first surface 210A of the second glass substrate 200 has the following feature, when the central region, the peripheral region, the edge region, the non-edge region, and the effective region are defined as described above, whether the first surface 210A has a convex profile or a concave profile is determined as described above, and the manipulations illustrated in FIG. 3 to FIG. 8 are performed:

(i) in a case where the first surface 210A has a convex profile, the mode which the first straight line $ST_1$ is located under the first reference curve $R_1$ and the second straight line $ST_2$ is located under the second reference curve $R_2$ holds in 75% or more of the cross sections taken along all of the particular vertical lines Ta and the particular horizontal lines Ua; or (ii) in a case where the first surface 210A has a concave profile, the mode which the first straight line $ST_1$ is located over the first reference curve $R_1$ and the second straight line $ST_2$ is located over the second reference curve $R_2$ holds in 75% or more of the cross sections taken along all of the particular vertical lines Ta and the particular horizontal lines Ua.

The second surface 210B of the second glass substrate 200 has the feature that the PV value in the effective region is 70 nm or less and the feature equivalent to the above feature (i) or (ii).

However, in the second glass substrate 200, it is necessary that the following matching conditions be satisfied in relation to the kind of the profile (convex profile or concave profile) of the first surface 210A and that of the second surface 210B.

In a case where the first surface 210A has a convex profile, it is necessary that the second surface 210B also have a convex profile (i.e., both of the first surface 210A and the second surface 210B have a convex profile), and that the mode which:

the first straight line $ST_1$ is located under the first reference curve $R_1$; and the second straight line $ST_2$ is located under the second reference curve $R_2$ hold in 75% or more of the cross sections taken along all of the particular vertical lines Ta and the particular horizontal lines Ua.

In a case where the first surface 210A has a concave profile, it is necessary that the second surface 210B also have a concave profile (i.e., both of the first surface 210A and the second surface 210B have a concave profile), and that the mode which:

the first straight line $ST_1$ is located over the first reference curve $R_1$; and the second straight line $ST_2$ is located over the second reference curve $R_2$ hold in 75% or more of the cross sections taken along all of the particular vertical lines Ta and the particular horizontal lines Ua.

The sentence that "both of the first surface 210A and the second surface 210B have a convex profile" means a mode which, when the central region (called a "first central region 230A) of the first surface 210A and the central region (called a "second central region 230B) of the second surface 210B on the side opposite to the first surface 210A are integrally observed from the direction perpendicular to the thickness direction of the second glass substrate 200, the first central region 230A relatively projects outward (i.e., to the side opposite to the second central region 230B and the second central region 230B relatively projects inward (i.e., to the side of the first central region 230A).

Figure 10:
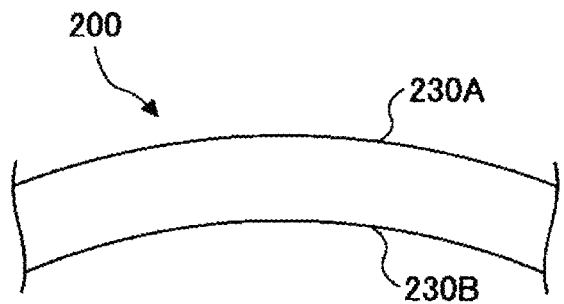
FIG. 10 is a schematic sectional view of a central portion of the glass substrate (second glass substrate) according to an embodiment of the present invention in a case where both of its first surface and second surface have a convex profile.

FIG. 10 schematically shows the second glass substrate 200 being in such a mode.

The sentence that "both of the first surface 210A and second surface 210B have a concave profile" means a mode which, when the first central region 230A of the first surface 210A and the second central region 230B of the second surface 210B on the side opposite to the first surface 210A are integrally observed from the direction perpendicular to the thickness direction of the second glass substrate 200, the first central region 230A relatively projects inward (i.e., to the side of the second central region 230B) and the second central region 230B relatively projects outward (i.e., to the side opposite to the first central region 230A).

Figure 11:
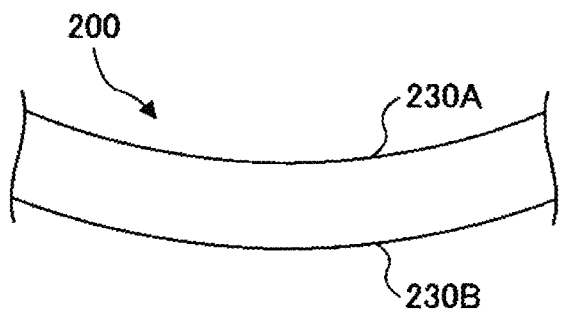
FIG. 11 is a schematic sectional view of a central portion of the glass substrate (second glass substrate) according to an embodiment of the present invention in a case where both of its first surface and second surface have a concave profile.

FIG. 11 schematically shows the second glass substrate 200 being in such a mode.

The second glass substrate 200 having the above features can provide the same advantages as the first glass substrate 100. That is, when a photomask formed using the above-described second glass substrate 200 is chucked and placed on a mask stage of an exposing machine, the flatness of the photomask can be significantly improved by a synergy effect of high flatness of the photomask itself and deformation that is caused by the chucking. For example, very high flatness such as 30 nm can be attained in the first surface of the photomask.

In the second glass substrate 200, the flatness of both of the first surface 210A and the second surface 210B can be significantly improved when a photomask formed using the second glass substrate 200 is chucked and placed on a mask stage of an exposing machine with its second surface 210B.

As such, the second glass substrate 200 can be used suitably as what is called a reflection photomask with which a photolithography process is executed on a semiconductor substrate in such a manner that exposing light is reflected by one of the two surfaces of the second glass substrate 200.

(Mask Blank According to an Embodiment of the Present Invention)

Next, a mask blank according to an embodiment of the present invention will be described with reference to FIG. 12.

Figure 12:
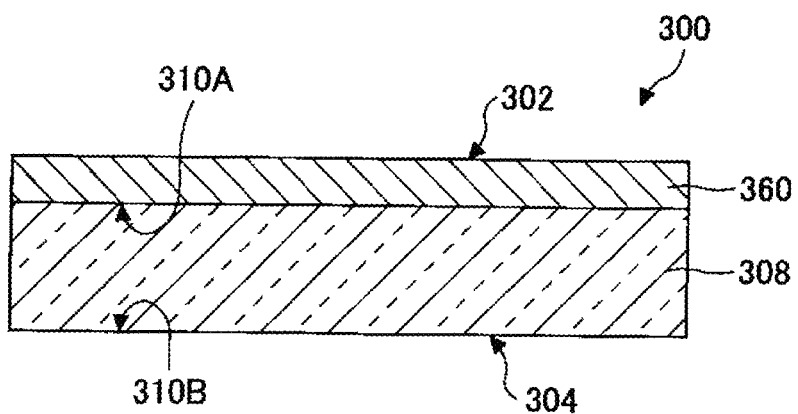
FIG. 12 is a schematic sectional view of a mask blank according to an embodiment of the present invention.

FIG. 12 is a schematic sectional view of a mask blank (hereinafter referred to as a "first mask blank 300") according to an embodiment of the present invention.

As shown in FIG. 12, the first mask blank 300 includes a glass substrate 308 and a light shield film 360. From another point of view, the first mask blank 300 has a first surface 302 which is located on the side of the light shield film 360, and the first mask blank 300 has a second surface 304 which is located on the side of the glass substrate 308.

The glass substrate 308 has a first surface 310A and a second surface 310B, which face each other, and the light shield film 360 is formed on the first surface 310A.

The light shield film 360 has a function of interrupting light in a prescribed wavelength range. The light shield film 360 may be made of, for example, metallic chromium.

In the first mask blank 300, another layer may be formed on the side(s) of the first surface 310A and/or second surface 310B of the glass substrate 301.

In the first mask blank 300, the glass substrate 308 is constituted by the first glass substrate 100 having the above-described features.

As such, the first mask blank 300 provides the above-described advantage that, when a photomask formed using it is chucked and placed on a mask stage of an exposing machine with its first surface 302 side, the flatness of the first surface 302 of the first mask blank 300 can be significantly improved.

In particular, the first mask blank 300 can be used suitably as what is called a transmission photomask with which a photolithography process is executed on a semiconductor substrate in such a manner that exposing light enters from the side of the first surface 302 and passes through the second surface 304.

Figure 13:
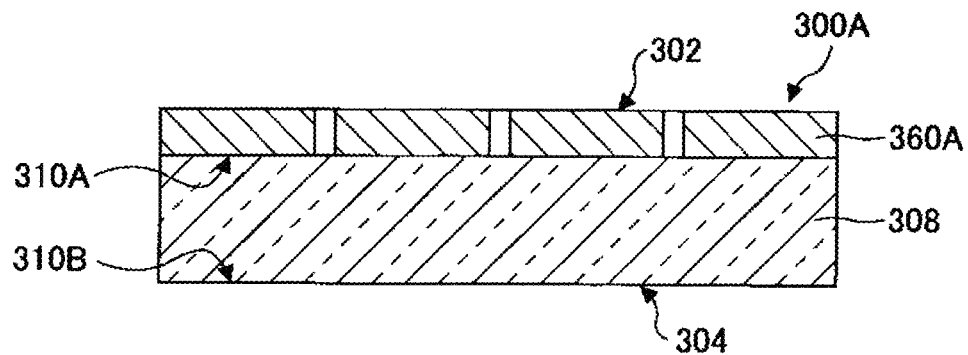
FIG. 13 is a schematic sectional view showing an example of a structure of a transmission photomask formed using the mask blank shown in FIG. 12.

FIG. 13 is a schematic sectional view showing an example of a structure of such a transmission photomask 300A.

As shown in FIG. 13, the transmission photomask 300A has the same structure as the above-described first mask blank 300 except that the transmission photomask 300A has a patterned light shield film 360A which is formed on the first surface 310A of the glass substrate 308.

The transmission photomask 300A can be used suitably in an exposing machine having, as a light source, an ArF excimer laser, a KrF excimer laser, a mercury lamp or the like.

(Mask Blank According to an Embodiment of the Present Invention)

Next, a mask blank according to an embodiment of the present invention will be described with reference to FIG. 14.

Figure 14:
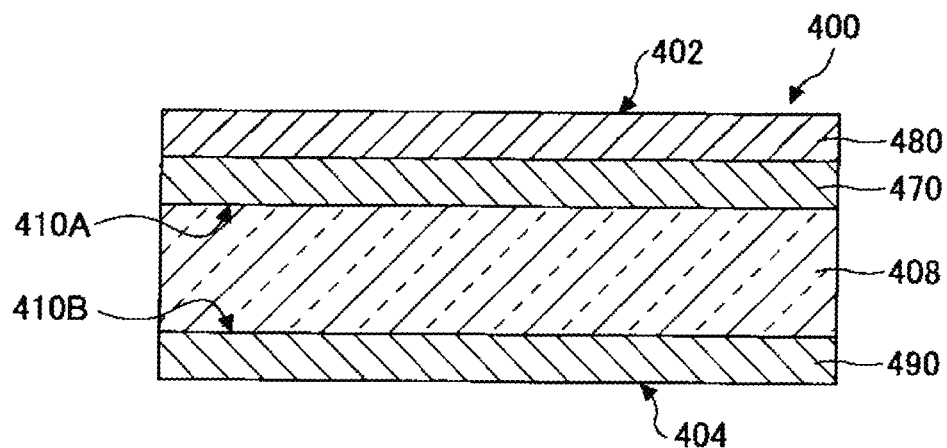
FIG. 14 is a schematic sectional view of another mask blank according to an embodiment of the present invention.

FIG. 14 is a schematic sectional view of a mask blank (hereinafter referred to as a "second mask blank 400") according to an embodiment of the present invention.

As shown in FIG. 14, the second mask blank 400 has a first surface 402 and a second surface 404. From another point of view, the second mask blank 400 includes a glass substrate 408, a reflection film 470, an absorption film 480, and a conductive film 490.

The glass substrate 408 has a first surface 410A and a second surface 410B, which face each other. The reflection film 470 and the absorption film 480 are formed on/above the first surface 410A of the glass substrate 408. On the other hand, the conductive film 490 is formed on the second surface 410B of the glass substrate 408.

The first surface 402 of the second mask blank 400 is located on the side of the absorption film 480, and the second surface 404 of the second mask blank 400 is located on the side of the conductive film 490.

In the second mask blank 400, another layer may be formed on the side(s) of the first surface 410A and/or second surface 410B of the glass substrate 401.

The reflection film 470 has a function of reflecting light in a particular wavelength range (e.g., EUV (extreme ultraviolet) light). The reflection film 470 may be, for example, multilayer film in which large refractive index layers (e.g., made of silicon) and small refractive index layers (e.g., made of molybdenum) are alternately stacked.

The absorption film 480 has a role of absorbing light in a particular wavelength range, and may contain, for example, at least one of the elements selected from the group consisting of tantalum, chromium, and palladium. For example, the absorption film 480 may be a monometal, an alloy, a nitride, an oxide, an oxynitride, or the like, which contains at least one of the above elements.

The conductive film 490 is made of a material that is conductive and low in surface roughness such as Si, TiN, Mo, Cr, CrN, or MoSi, a transparent conductive oxide, or the like. The conductive film 490 has a role of mounting a photomask (described later) formed by using the second mask blank 400 on a mask stage of an exposing machine. That is, the photomask can be mounted on the mask stage utilizing an electrostatic effect that the conductive film 490 exhibits.

The conductive film 490 may be omitted at the stage of the second mask blank 400.

In the second mask blank 400, the glass substrate 408 is, for example, constituted of the second glass substrate 200 having the above-described features.

As such, the second mask blank 400 provides the above-described advantage that, when a photomask formed using it is mounted on a mask stage with its second surface 404 in contact with the mask stage, the flatness of the first surface 402 and the second surface 404 of the second mask blank 400 can be significantly improved.

In particular, the second mask blank 400 can be used suitably as what is called a reflection photomask with which a photolithography process is executed on a semiconductor substrate in such a manner that exposing light enters from the side of the first surface 402 and reflected by the photomask.

Figure 15:
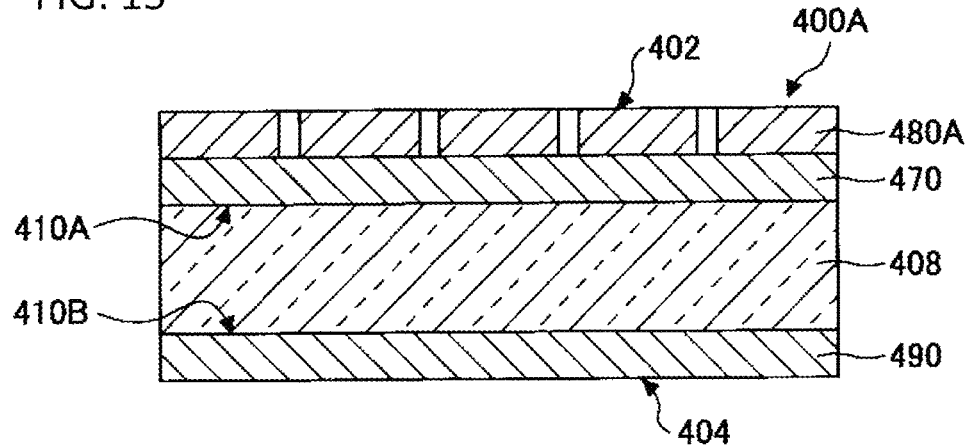
FIG. 15 is a schematic sectional view showing an example of a structure of a reflection photomask formed using the mask blank shown in FIG. 14.

FIG. 15 is a schematic sectional view showing an example of a structure of such a reflection photomask 400A.

As shown in FIG. 15, the reflection photomask 400A has the same structure as the above-described second mask blank 400 except that the reflection photomask 400A has a patterned absorption film 480A which is formed on the side of the first surface 410A of the glass substrate 408.

The reflection photomask 400A can be used suitably in, for example, an exposing machine that uses EUV light.

Examples

Examples of the present invention will be described below. In the following description, the Case No. 1 to No. 4, No. 11, and No. 12 are Examples (working examples), while Case No. 5 to No. 8 are Comparative Examples.
(Case No. 1)

A glass substrate for a mask blank was produced by polishing both surfaces of a glass plate locally by the following method.

An original glass plate was a square quartz glass plate that measured 152 mm (vertical)×152 mm (horizontal)×6.5 mm (thickness).

This glass plate was subjected to a first polishing process, a second polishing process, a third polishing process, a local polishing process, and a finishing process in this order. As a result, the thickness of the glass plate decreased to about 6.35 mm.

In the first polishing process, both surfaces of the glass plate were polished simultaneously using a double-sided polishing machine available on the market.

Polishing slurry was an aqueous solution containing abrasive particles (cerium oxide) of 1.5 µm in average diameter. Urethane-based polishing pads were used.

In the second polishing process, both surfaces of the glass plate were polished simultaneously using a double-sided polishing machine. Polishing slurry was an aqueous solution containing abrasive particles (cerium oxide) of 1.0 µm in average diameter. Suede-based polishing pads were used.

In the third polishing process, both surfaces of the glass plate were polished simultaneously using a double-sided polishing machine. Polishing slurry was an aqueous solution of pH3 containing abrasive particles (colloidal silica) of 20 nm in average diameter. Polishing pads were supersoft suede-based polishing cloths.

In the local polishing process, the above-described special local polishing method was employed. That is, polishing was performed in such a manner that the polishing conditions of a local processing tool were changed depending on the case of scanning the central region of the first surface the glass plate or the case of scanning its edge region.

More specifically, a polishing tool and a control stage were used and polishing rates at respective positions were controlled by varying the stage speed with respect to each coordinate in the surface of the glass substrate. In local polishing methods using a polishing tool, the tool pressing amount, rotation speed, and pressure, the angle formed by the tool and the plate, the stage speed, and other conditions can be set. In the case No. 1, tool pressing amounts for the respective edge region were set independently, followed by performing processing.

Polishing slurry was an aqueous solution containing abrasive particles (cerium oxide) of 1.0 µm in average diameter. A small polishing tool to which a suede pad was stuck was used.

In the finishing process, both surfaces of the glass plate were polished simultaneously using a double-sided polishing machine available on the market. Polishing slurry was an aqueous solution containing 20 wt % of colloidal silica of less than 20 nm in average primary particle diameter. Polishing pads "Bellatrix N7512" of Filwel Co., Ltd. were used.

A glass substrate (hereinafter referred to as "glass substrate A") for a mask blank was produced by the above-described processes.
(Evaluations)

The first surface of the glass substrate A was evaluated in the following manner.
(Evaluation of Profiles in Effective Region of First Surface)

First, 218 vertical lines T and 218 horizontal lines U were drawn in the effective region of the first surface and relative heights were measured at respective positions in cross sections taken along the straight lines T and U. The vertical lines T and the horizontal lines U were drawn at constant intervals.

Figure 16:
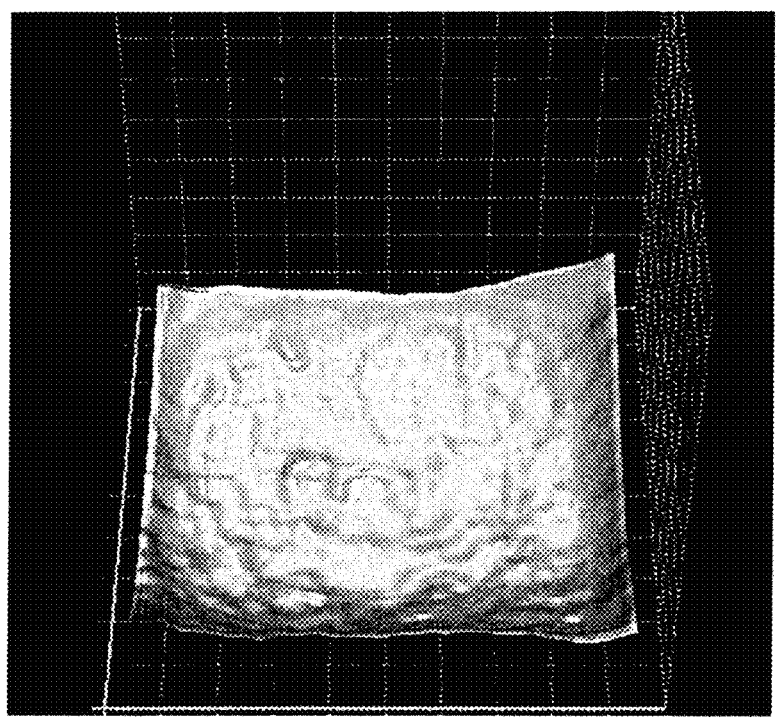
FIG. 16 shows a height map image of profiles measured in the effective region of the first surface of a glass substrate A.
Figure 17:
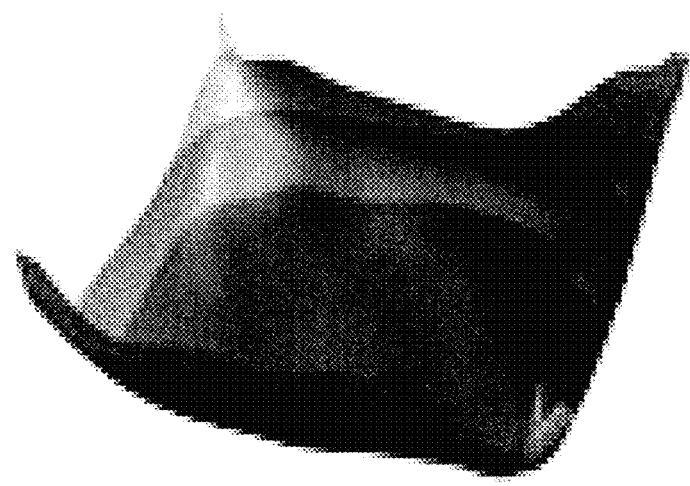
FIG. 17 is a bird's eye image prepared by filtering the data of FIG. 16 having small projections and recesses.

FIG. 16 shows a height map image of profiles measured in the effective region of the first surface of the glass substrate A. In this height map image, although height differences are indicated in colors, projection/recessing relationships between the regions are not clear. To solve this problem, the data of FIG. 16 having small projections and recesses were subjected to filtering, whereby a bird's eye image that is higher in visibility was prepared as shown in FIG. 17.

Then, a central average height $H_{ave130}$ was calculated by averaging the heights at the respective measurement positions on all vertical lines T and horizontal lines U passing through the central region. Likewise, a peripheral average height $H_{ave132}$ was calculated by averaging the heights at the respective measurement positions on all vertical lines T and horizontal lines U passing through the peripheral region. As a result, the relation of $H_{ave130} < H_{ave132}$ was obtained, which meant that the first surface had a concave profile.

The PV value of the first surface in the effective region was 51 nm.

Then, a fitting curve F was calculated by a curve fitting based on each point, included in the non-edge region, of a ridge line profile in the cross section of each of particular vertical lines Ta (each of which crosses each of the edge region and the peripheral region two times) and particular horizontal lines Ua (each of which crosses each of the edge region and the peripheral region two times) by a least squares method using a fourth-order polynomial.

An extrapolation curve φ was calculated by extrapolating each fitting curve F to the ends of the effective region, whereby a first portion $\phi_1$ and a second portion $\phi_2$ were obtained as two respective end portions of the fitting curve F.

Figure 18:
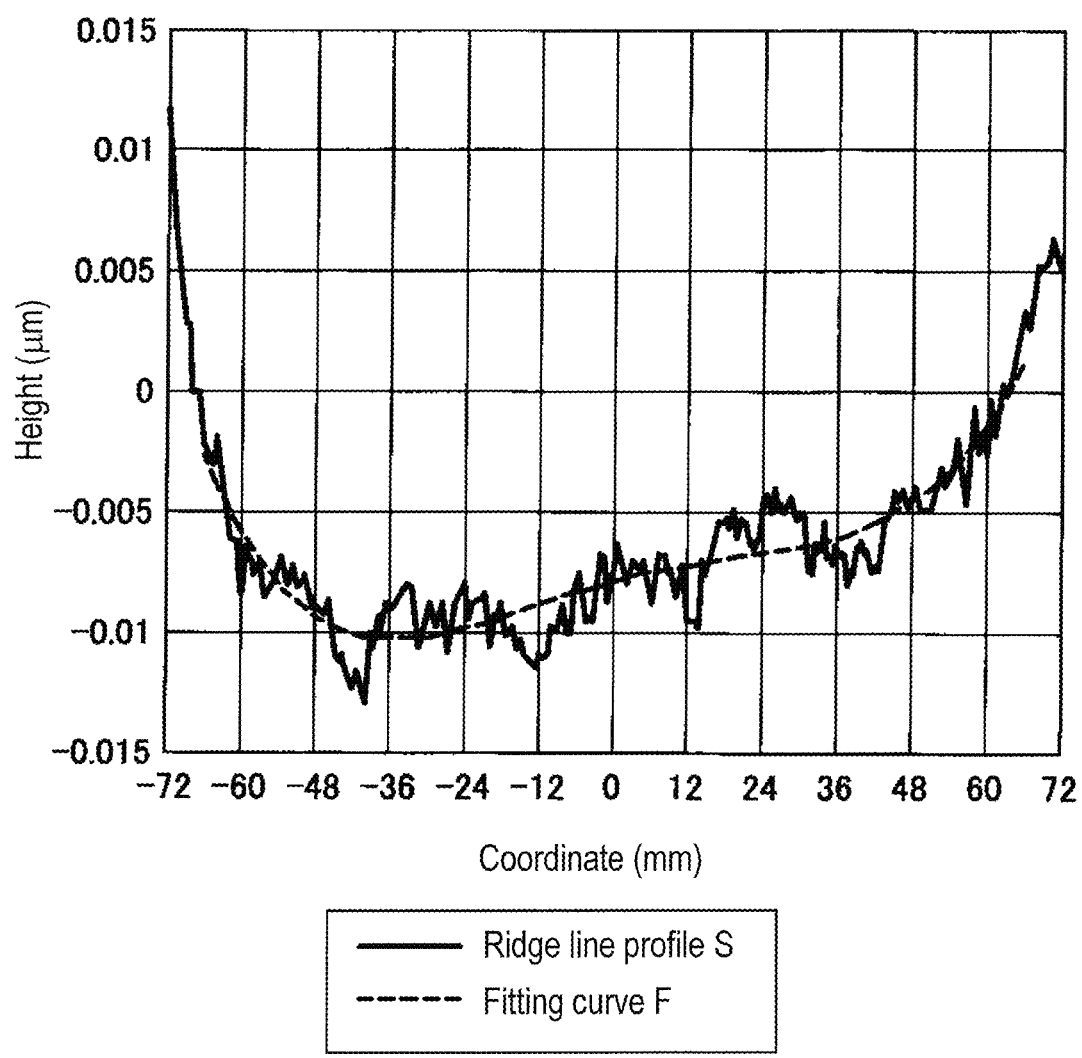
FIG. 18 is a graph showing a ridge line profile obtained in a cross section taken along one particular vertical line on the first surface of the glass substrate A and a fitting curve for it.

FIG. 18 shows an example of a fitting curve F calculated from a ridge line profile S of one particular vertical line Ta. In FIG. 18, the measured ridge line profile S is represented by a solid line and the fitting curve F obtained by a curve fitting based on each point included in the non-edge region (the coordinate on the horizontal axis is in a range of −66 mm to +66 mm) is represented by a broken line.

Figure 19:
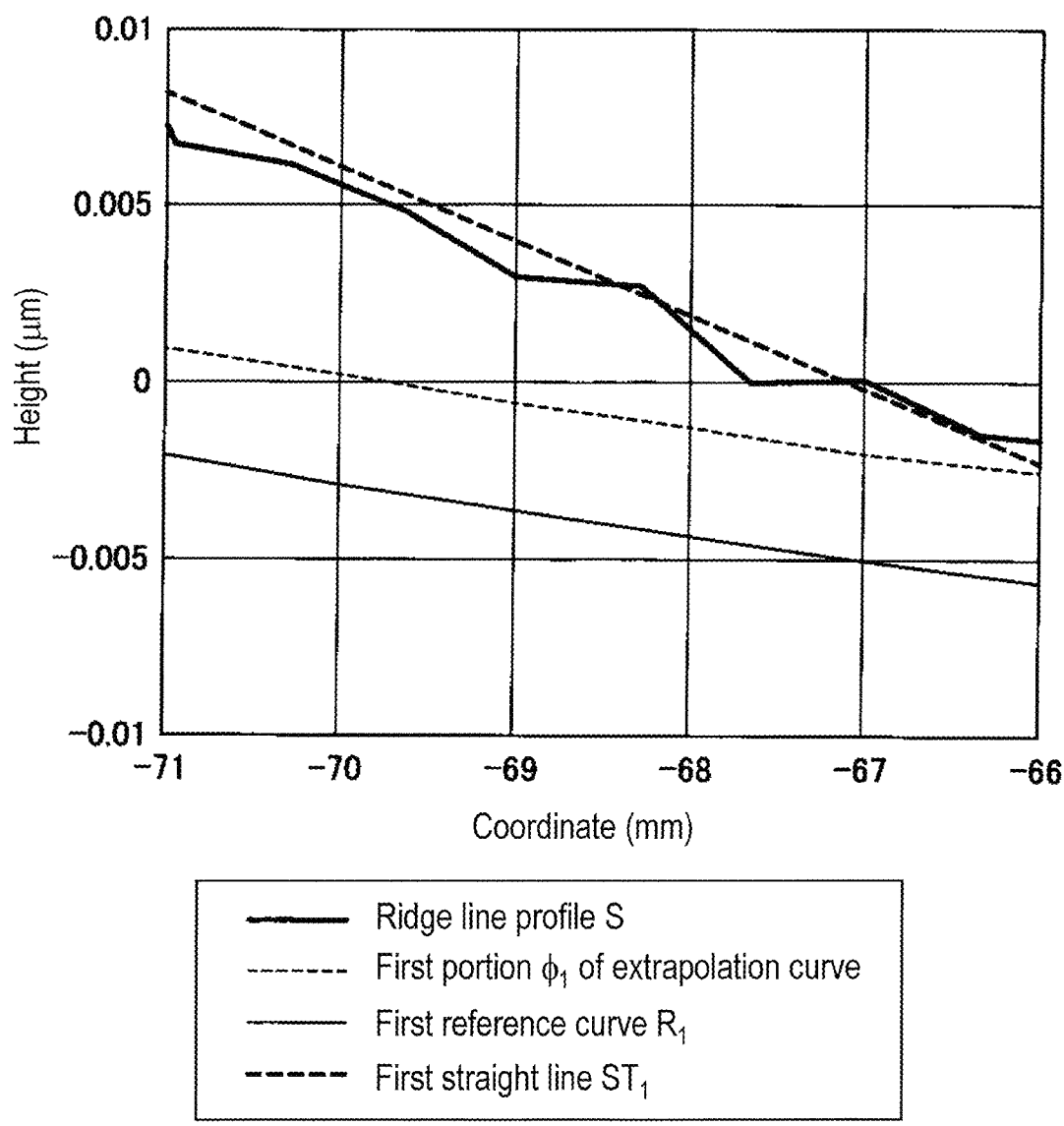
FIG. 19 is a graph showing a first portion of an extrapolation curve, a first reference curve, and a first straight line together with a portion, in a coordinate range of −71 mm to −66 mm (edge region), of a ridge line profile of the first surface of the glass substrate A.

FIG. 19 is an enlarged graph showing a first portion $\phi_1$ (thin broken line) of an extrapolation curve $\phi$ obtained by extrapolating the fitting curve F to the end of the effective region. Likewise, FIG. 20 is an enlarged graph showing a second portion $\phi_2$ (thin broken line) of the extrapolation curve $\phi$ obtained by extrapolating the fitting curve F to the end of the effective region.

A first reference curve $R_1$ was calculated by subtracting 3 nm from the height values of the first portion $\phi_1$. Likewise, a second reference curve $R_2$ was calculated by subtracting 3 nm from the height values of the second portion $\phi_2$.

Figure 20:
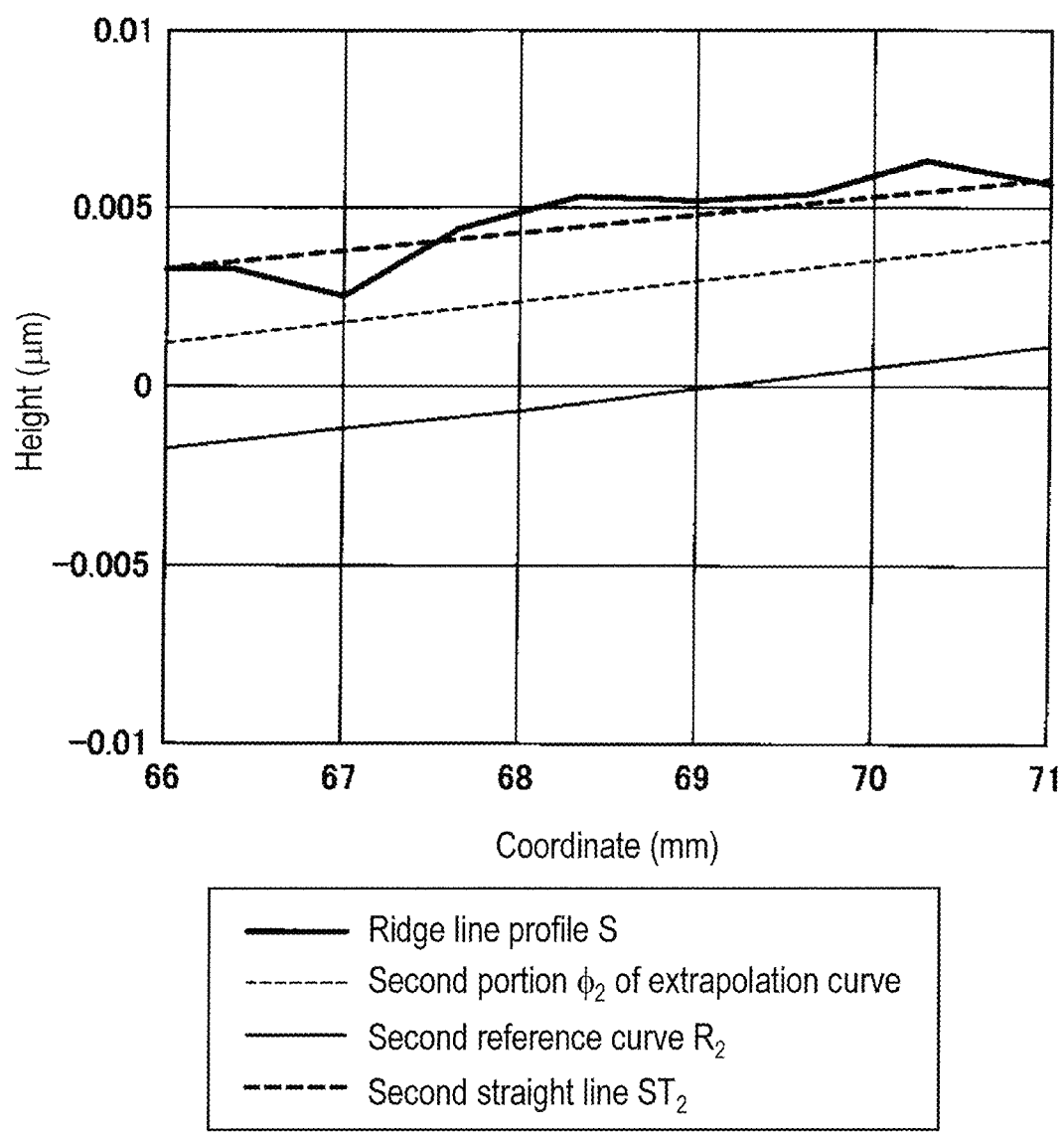
FIG. 20 is a graph showing a second portion of the extrapolation curve, a second reference curve, and a second straight line together with a portion, in a coordinate range of +66 mm to +71 mm (edge region), of the ridge line profile of the first surface of the glass substrate A.

FIG. 19 and FIG. 20 also show the first reference curve $R_1$ (thin solid line) and the second reference curve $R_2$ (thin solid line), respectively.

FIG. 19 also shows, together with the first portion $\phi_1$ (thin broken line) of the extrapolation curve $\phi$ and the first reference curve $R_1$ (thin solid line), a portion (thick solid line; hereinafter referred to as a "first corresponding portion"), in a coordinate range of −71 mm to −66 mm, of the ridge line profile S. FIG. 20 also shows, together with the second portion $\phi_2$ (thin broken line) of the extrapolation curve $\phi$ and the second reference curve $R_2$ (thin solid line), a portion (thick solid line; hereinafter referred to as a "second corresponding portion"), in a coordinate range of +66 mm to +71 mm, of the ridge line profile S.

Then, a first straight line $ST_1$ is calculated by performing straight line approximation of a least squares method on the points of the first corresponding portion (in the edge region) of the ridge line profile S. In addition, a second straight line $ST_2$ is calculated by performing straight line approximation of the least squares method on the points of the second corresponding portion (in the edge region) of the ridge line profile S.

FIG. 19 and FIG. 20 show, by thick broken lines, the first straight line $ST_1$ and the second straight line $ST_2$ obtained by the above manipulation, respectively.

Subsequently, a relative positional relationship between the first straight line $ST_1$ and the first reference curve $R_1$ and a relative positional relationship between the second straight line $ST_2$ and the second reference curve $R_2$ are judged. If the first straight line $ST_1$ is located over the first reference curve $R_1$ and the second straight line $ST_2$ is located over the second reference curve $R_2$, it is judged that the ridge line profile S is in a proper form.

In the case shown in FIG. 19, it is seen that the first straight line $ST_1$ is located over the first reference curve $R_1$. In the case shown in FIG. 20, it is seen that the second straight line $ST_2$ is located over the second reference curve $R_2$. Thus, it is judged that the ridge line profile S of this particular vertical line Ta was in a proper form.

The above manipulations were performed for all of the particular vertical lines Ta and the particular horizontal lines Ua, and a percentage Q of ridge line profile S that were in a proper form was calculated.

In the glass substrate A, the percentage Q was 94%.

(Evaluation of Flatness Upon Chucking)

Subsequently, flatness of the first surface of the glass substrate A when the glass substrate A is chucked and placed on a mask stage was evaluated. In this case, it was assumed that a peripheral portion of the first surface of the glass substrate A that was part of a transmission photomask was subjected to chucking.

Usually, when a photomask is chuck and placed on a mask stage, its first surface is corrected in accordance with a quadratic function to improve the PV value in the effective region.

The quadratic function used in this case is given by the following Equation (1):

$$Z_{fit}=a+bX+cY+dXY+eX^2+fY^2 \quad (1)$$

where a, b, c, d, e and f are coefficients, X and Y are the coordinates of a coordinate system defined by two axes that are parallel with two respective orthogonal sides of a square on the substrate surface and are equal to (0, 0) at the center of the substrate, and Z is the height of a substrate profile.

The PV value of heights that remain after the correction in accordance with the quadratic function $Z_{fit}$ in the first surface of the glass substrate A was calculated to be 25 nm.

A correction effectiveness factor V (%) that is defined by the following Equation (2) was equal to 51%.

$$V(\%)=(1-PV_c/PV_a)\times 100 \quad (2)$$

where $PV_a$ is the PV value in the effective region of the first surface before the correction in accordance with the quadratic function $Z_{fit}$ and $PV_c$ is the PV value in the same region after the correction in accordance with the quadratic function $Z_{fit}$.

The kind of profile (convex profile or concave profile), the percentage Q, the PV values ($PV_a$ and $PV_c$) in the effective region of the first surface, and the correction effectiveness factor V that were obtained for the glass substrate A are shown together in the row of the case No. 1 of the following Table 1:

TABLE 1

| Case No. | Kind of Profile | Percentage Q (%) | $PV_a$ (nm) | $PV_c$ (nm) | Correction effectiveness factor V (%) |
|---|---|---|---|---|---|
| 1 | Concave | 94 | 51 | 25 | 51 |
| 2 | Concave | 91 | 45 | 25 | 45 |
| 3 | Concave | 97 | 46 | 24 | 48 |
| 4 | Concave | 91 | 51 | 23 | 55 |
| 5 | Convex | 16 | 51 | 45 | 12 |
| 6 | Concave | 52 | 50 | 38 | 24 |
| 7 | Concave | 9 | 51 | 50 | 2 |
| 8 | Convex | 27 | 49 | 44 | 10 |

(Case No. 2 to No. 4)

Glass substrates for a mask blank in the case No. 2 to No. 4 were produced by the same method as in the case No. 1 except that, in the local polishing processes of the case No. 2 to No. 4, the polishing conditions for each side of the edge region of the first surface were adjusted using parameters different from those in the case No. 1. More specifically, for the substrate of the case No. 2, the rotation speed of the tool was changed between each side and the central region. For the substrate of the case No. 3, the stage speed was changed between each side and the central region. For the substrate of the case No. 4, the angle formed by the tool and the substrate was changed between each side and the central region. The polishing conditions for each side were set separately.

In the case No. 2 to No. 4, the first surface of each of produced glass substrates for a mask blank (hereinafter referred to as "glass substrates B to D") were evaluated by the same method as in the case No. 1.

Figure 21:
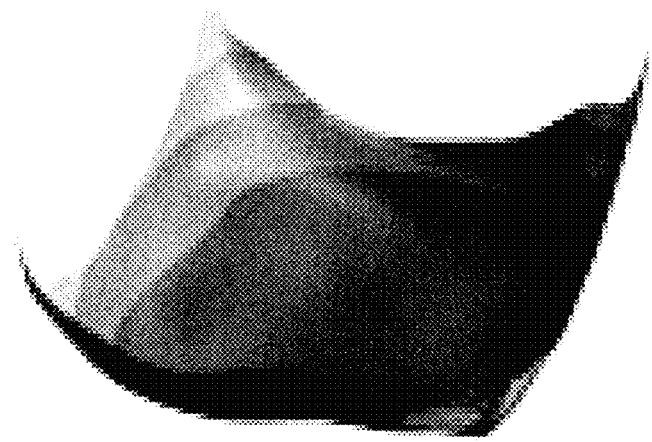
FIG. 21 is a bird's eye image prepared by filtering the data of a profile, measured in the effective region and having small projections and recesses, of the first surface of a glass substrate B.
Figure 22:
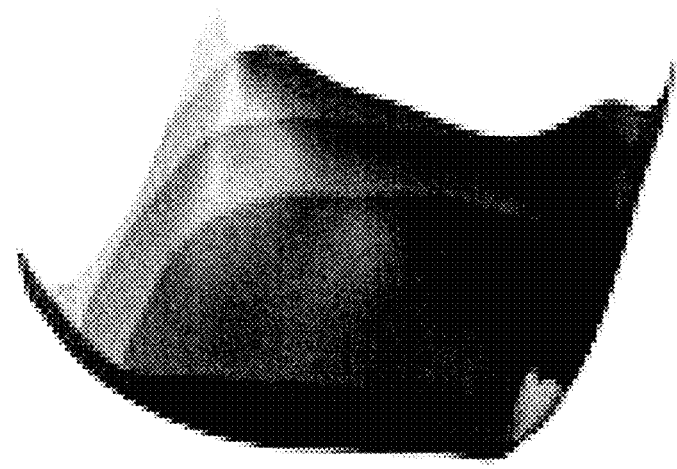
FIG. 22 is a bird's eye image prepared by filtering the data of a profile, measured in the effective region and having small projections and recesses, of the first surface of a glass substrate C.
Figure 23:
FIG. 23 is a bird's eye image prepared by filtering the data of a profile, measured in the effective region and having small projections and recesses, of the first surface of a glass substrate D.

FIG. 21 to FIG. 23 are bird's eye images that were prepared from profiles measured in the effective regions of the first surfaces of the glass substrates B to D, respectively. It is seen from FIG. 21 to FIG. 23 that the first surfaces of all of the glass substrates B to D had a concave profile.

The kind of profile (convex profile or concave profile), percentages Q, PV values ($PV_a$ and $PV_c$) in the effective region of the first surface, and correction effectiveness factors V that were obtained for the glass substrates B to D are shown together in the rows of the case No. 2 to No. 4 in Table 1.

(Case No. 5)

A glass substrate for a mask blank was prepared by the same method as in the case No. 1 except that, in the local polishing process of the case No. 5, polishing in the entire effective region of the first surface was performed under the same conditions.

The first surface of a produced glass substrate for a mask blank (hereinafter referred to as a "glass substrate E") was evaluated by the same method as in the case No. 1.

Figure 24:
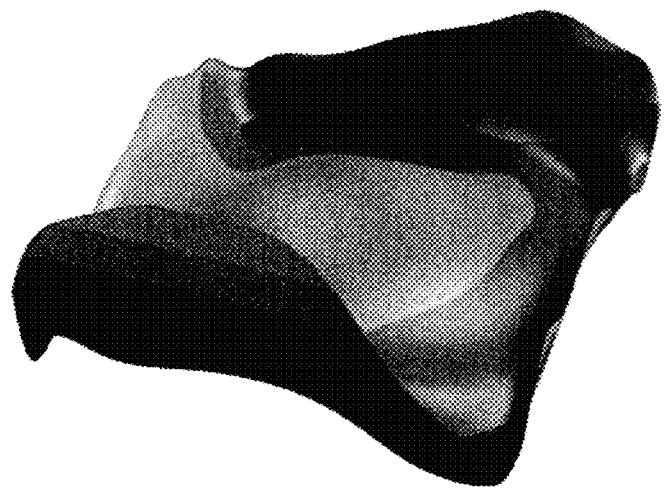
FIG. 24 is a bird's eye image prepared by filtering the data of a profile, measured in the effective region and having small projections and recesses, of the first surface of a glass substrate E.

FIG. 24 is a bird's eye image that was prepared from a profile measured in the effective region of the first surface of the glass substrate E. It is seen from FIG. 24 that the first surface of the glass substrate E had a convex profile.

Figure 25:
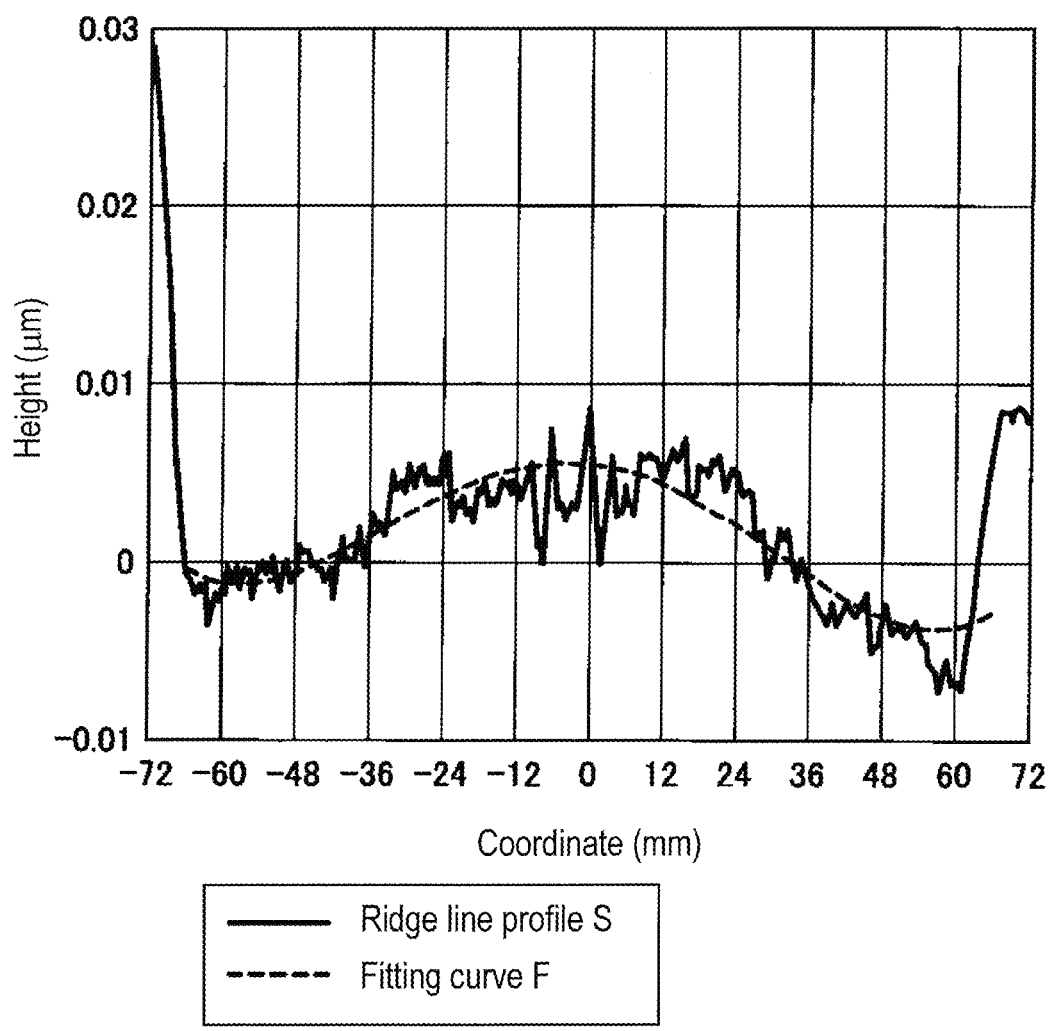
FIG. 25 is a graph showing a ridge line profile obtained in a cross section taken along one particular vertical line on the first surface of a glass substrate E and a fitting curve for it.

FIG. 25 shows an example of a fitting curve F calculated from a ridge line profile S of one particular vertical line Ta. In FIG. 25, the measured ridge line profile S is represented by a solid line and the fitting curve F obtained by a curve fitting based on each point included in the non-edge region (the coordinate on the horizontal axis is in a range of −66 mm to +66 mm) is represented by a broken line.

Figure 26:
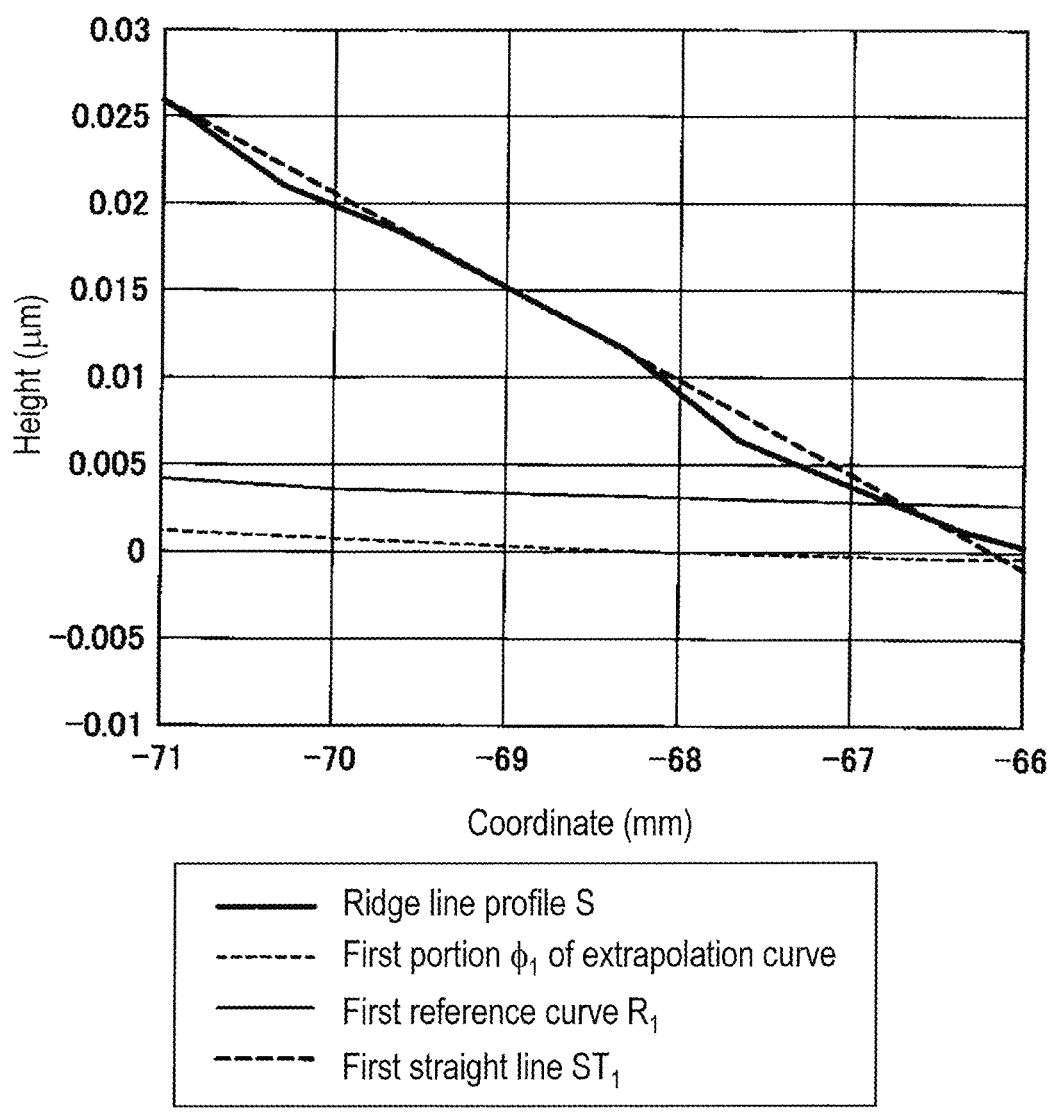
FIG. 26 is a graph showing a first portion of an extrapolation curve, a first reference curve, and a first straight line together with a portion, in a coordinate range of −71 mm to −66 mm (edge region), of a ridge line profile of the first surface of the glass substrate E.

FIG. 26 is an enlarged graph showing a first portion $\phi_1$ (thin broken line) of an extrapolation curve $\phi$ obtained by extrapolating the fitting curve F to the end of the effective region. Likewise, FIG. 27 is an enlarged graph showing a second portion $\phi_2$ (thin broken line) of the extrapolation curve $\phi$ obtained by extrapolating the fitting curve F to the end of the effective region.

A first reference curve $R_1$ was calculated by adding 3 nm to the height values of the first portion $\phi_1$. Likewise, a second reference curve $R_2$ was calculated by adding 3 nm to the height values of the second portion $\phi_2$.

Figure 27:
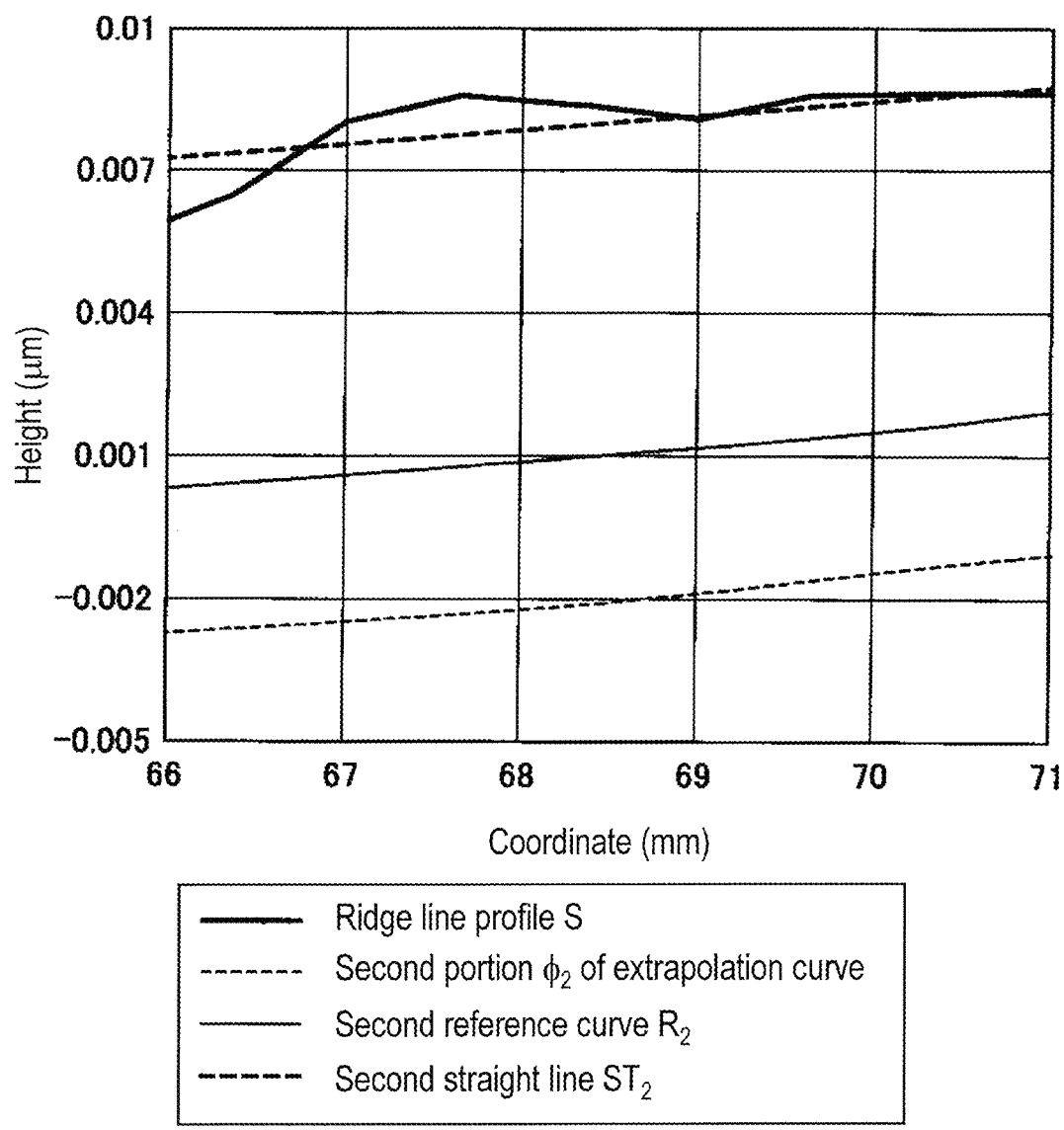
FIG. 27 is a graph showing a second portion of the extrapolation curve, a second reference curve, and a second straight line together with a portion, in a coordinate range of +66 mm to +71 mm (edge region), of the ridge line profile of the first surface of the glass substrate E.

FIG. 26 and FIG. 27 also show the first reference curve $R_1$ (thin solid line) and the second reference curve $R_2$ (thin solid line), respectively.

FIG. 26 also shows, together with the first portion $\phi_1$ (thin broken line) of the extrapolation curve $\phi$ and the first reference curve $R_1$ (thin solid line), a portion (thick solid line; hereinafter referred to as a "first corresponding portion"), in a coordinate range of −71 mm to −66 mm, of the ridge line profile S. FIG. 27 also shows, together with the second portion $\phi_2$ (thin broken line) of the extrapolation curve $\phi$ and the second reference curve $R_2$ (thin solid line), a portion (thick solid line; hereinafter referred to as a "second corresponding portion"), in a coordinate range of +66 mm to +71 mm, of the ridge line profile S.

Then, a first straight line $ST_1$ was calculated by performing straight line approximation of a least squares method on the points of the first corresponding portion (in the edge region) of the ridge line profile S. In addition, a second straight line $ST_2$ was calculated by performing straight line approximation of the least squares method on the points of the second corresponding portion (in the edge region) of the ridge line profile S.

FIG. 26 and FIG. 27 show, by thick broken lines, the first straight line $ST_1$ and the second straight line $ST_2$ obtained by the above manipulation, respectively.

Subsequently, a relative positional relationship between the first straight line $ST_1$ and the first reference curve $R_1$ and a relative positional relationship between the second straight line $ST_2$ and the second reference curve $R_2$ were judged.

As a result, it was found that in this case, as seen from FIG. 26, it could not be said that the first straight line $ST_1$ is located under the first reference curve $R_1$. In addition, it was found that in this case, as seen from FIG. 27, it could not be said that the second straight line $ST_2$ is located under the second reference curve $R_2$. Thus, it was judged that the ridge line profile S (see FIG. 25) of this particular vertical line Ta was not in a proper form.

The above manipulations were performed for all of the particular vertical lines Ta and the particular horizontal lines Ua, and a percentage Q of ridge line profile S that were in a proper form was calculated.

In the glass substrate E, the percentage Q was 16%.

Subsequently, flatness of the first surface of the glass substrate E when the glass substrate E is chucked and placed on a mask stage was evaluated by the above-described method. As a result, the correction effectiveness factor V which is given by the above-mentioned Equation (2) was calculated to be 12%.

The kind of profile (convex profile or concave profile), the percentage Q, the PV values ($PV_a$ and $PV_c$) in the effective region of the first surface, and the correction effectiveness factor V that were obtained for the glass substrate E are shown together in the row of the case No. 5 of the above Table 1.

(Case No. 6 to No. 8)

Glass substrates for a mask blank were produced by the same method as in the case No. 5 except that, in the local polishing process of the case No. 6 to No. 8, polishing conditions different from those in the case No. 5 were employed. However, polishing in the entire effective region of the first surface was performed under the same conditions.

The produced glass substrates for a mask blank (hereinafter referred to as "glass substrates F to H") were evaluated by the same method as in the case No. 1.

Figure 28:
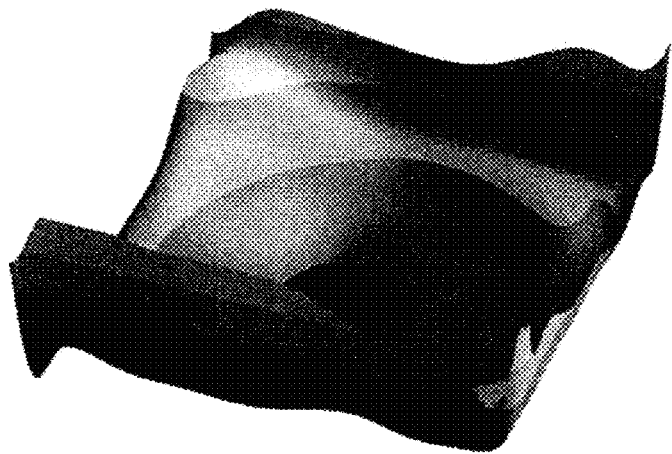
FIG. 28 is a bird's eye image prepared by filtering the data of a profile, measured in the effective region and having small projections and recesses, of the first surface of a glass substrate F.
Figure 29:
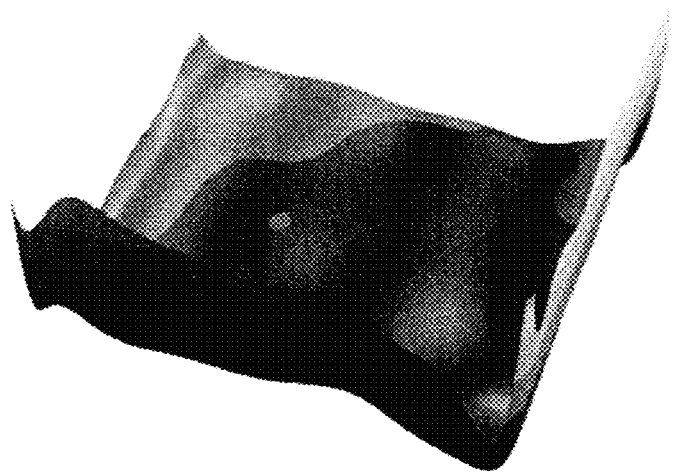
FIG. 29 is a bird's eye image prepared by filtering the data of a profile, measured in the effective region and having small projections and recesses, of the first surface of a glass substrate G.
Figure 30:
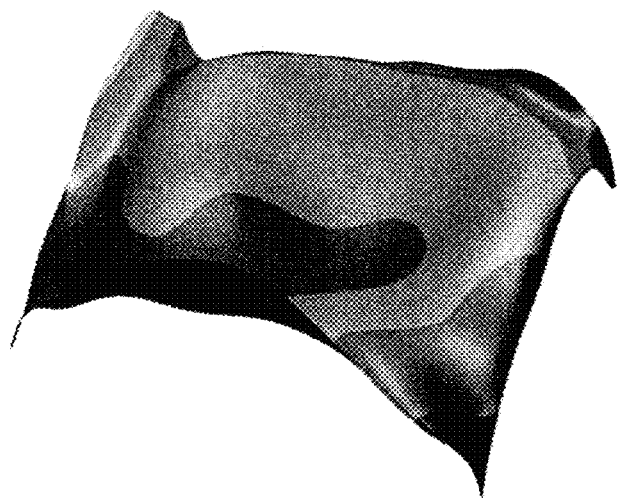
FIG. 30 is a bird's eye image prepared by filtering the data of a profile, measured in the effective region and having small projections and recesses, of the first surface of a glass substrate H.

FIG. 28 to FIG. 30 are bird's eye images that were prepared from profiles measured in the effective regions of the first surfaces of the glass substrates F to H, respectively. It is seen from FIG. 28 to FIG. 30 that the first surfaces of the glass substrates F and G had a concave profile whereas the first surface of the glass substrate H had a convex profile.

The kind of profile (convex profile or concave profile), percentages Q, PV values ($PV_a$ and $PV_c$) in the effective region of the first surface, and correction effectiveness factors V that were obtained for the glass substrates F to H are shown together in the rows of the case No. 6 to No. 8 of the above Table 1.

It is seen from the above results that the percentages Q of the case No. 1 to 4 are larger than 75% whereas the percentages Q of the case No. 5 to No. 8 are at most about 52%. It is also seen that the case No. 1 to No. 4 can provide correction effectiveness factors V that are significantly larger than the case No. 5 to No. 8, and hence can provide higher levels of flatness ($PV_c$) after chucking than the case No. 5 to No. 8. In particular, since the $PV_c$ values of the case No. 1 to No. 4 are smaller than 30 nm, it has been confirmed that the present invention will be able to well accommodate high levels of flatness that will be required in the future.

(Case No. 11)

A glass substrate for a mask blank was produced by the same method as in the case No. 1.

In the case No. 11, both surfaces of a glass plate were subjected to a first polishing process, a second polishing process, a third polishing process, a local polishing process, and a finishing process in this order.

As a result, a glass substrate (hereinafter referred to as a "glass substrate I") for a mask blank was produced. In the glass substrate I, the first surface had a PV value ($PV_a$ mentioned above) 60 nm in the effective region and the second surface had a PV value ($PV_b$ mentioned above) of 61 nm in the effective region.

(Evaluations)

Both of the first surface and the second surface of the produced glass substrate I was evaluated by the same method as in the case No. 1.

Figure 31:
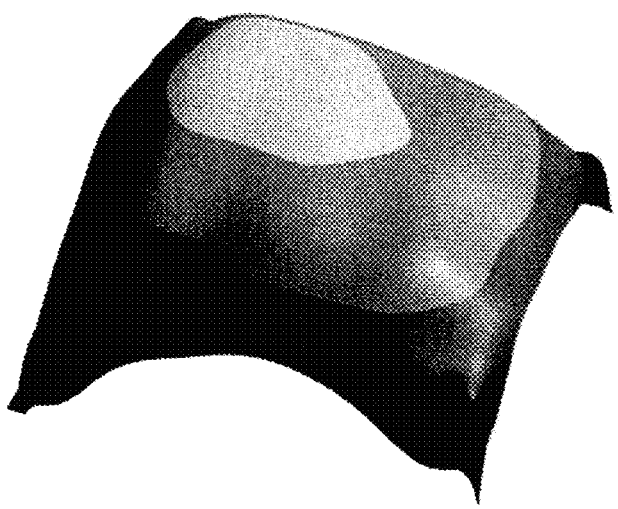
FIG. 31 is a bird's eye image prepared by filtering the data of a profile, measured in the effective region and having small projections and recesses, of the first surface of a glass substrate I.

FIG. 31 is a bird's eye image that was prepared from a profile measured in the effective region of the first surface of the glass substrate I. It is seen from FIG. 24 that the first surface of the glass substrate I had a convex profile.

Figure 32:
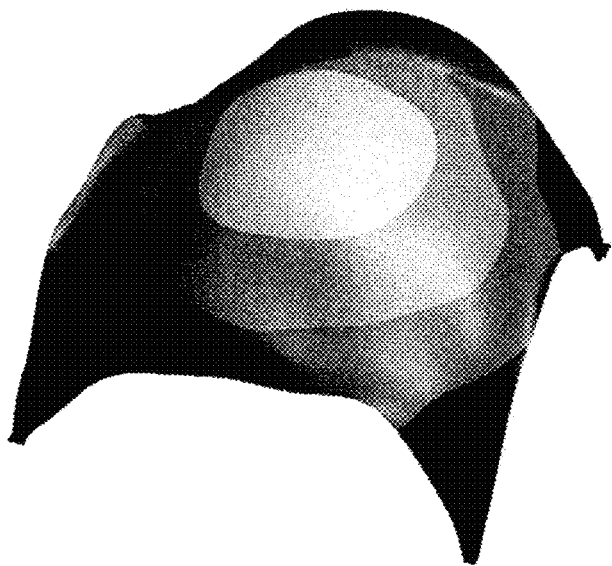
FIG. 32 is a bird's eye image prepared by filtering the data of a profile, measured in the effective region and having small projections and recesses, of the second surface of the glass substrate I.

FIG. 32 is a bird's eye image that was prepared from a profile measured in the effective region of the second surface of the glass substrate I. It is seen from FIG. 32 that the second surface of the glass substrate I had a convex profile.

The top-bottom direction of the bird's eye image of the second surface shown in FIG. 32 corresponds to that of the bird's eye image of the first surface shown in FIG. 31. That is, FIG. 31 and FIG. 32 correspond to the profile of the top surface (first surface) and the profile of the bottom surface (second surface), respectively, which were obtained when the glass substrate I was seen from a direction that was perpendicular to its thickness direction. In glass substrate I, both of the first surface and the second surface had a convex profile, and hence, the above mentioned matching conditions are satisfied.

Figure 33:
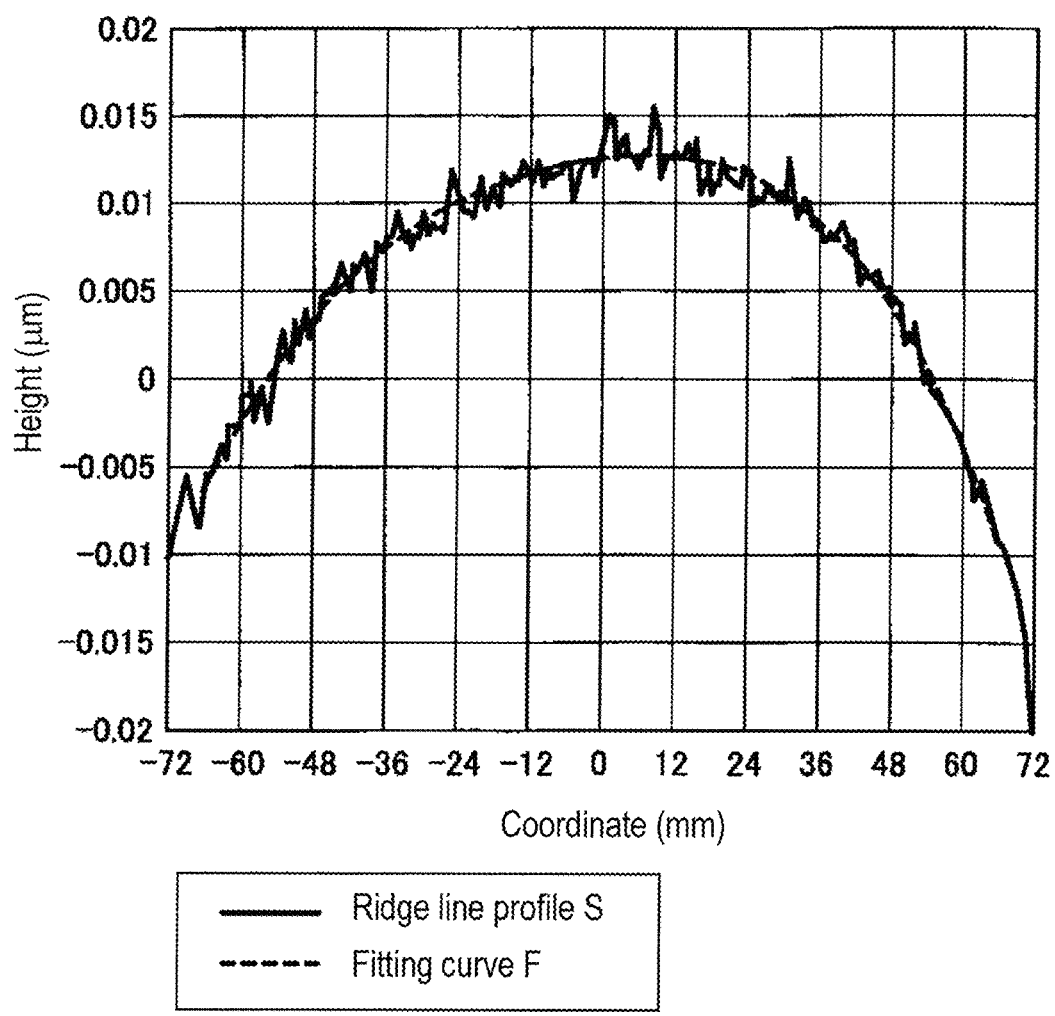
FIG. 33 is a graph showing a ridge line profile obtained in a cross section taken along one particular vertical line on the first surface of the glass substrate I and a fitting curve for it.

FIG. 33 shows an example of a fitting curve F calculated from a ridge line profile S of one particular vertical line Ta on the first surface. In FIG. 33, the measured ridge line profile S is represented by a solid line and the fitting curve F obtained by a curve fitting based on each point included in the non-edge region (the coordinate on the horizontal axis is in a range of −66 mm to +66 mm) is represented by a broken line.

Figure 34:
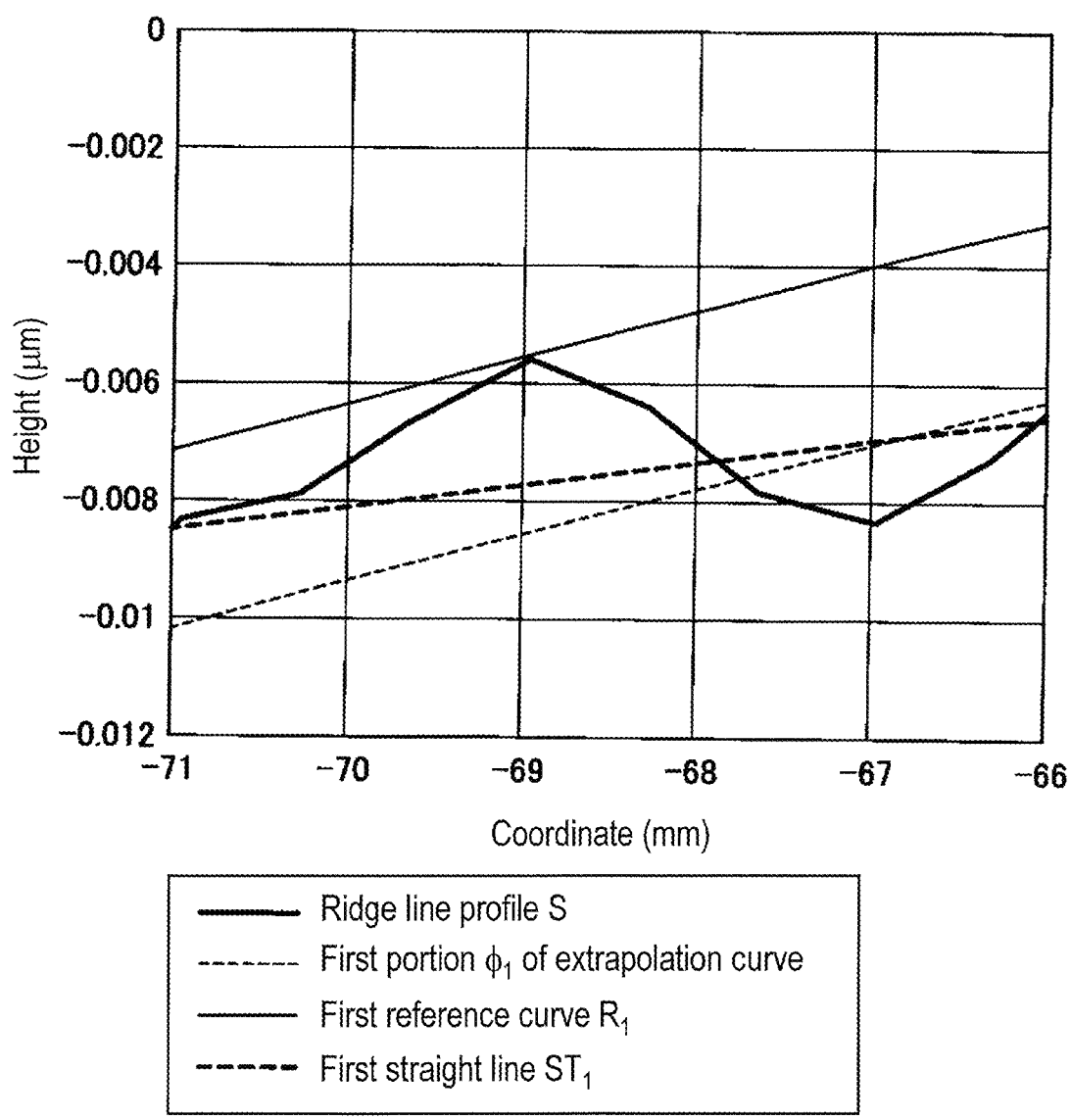
FIG. 34 is a graph showing a first portion of an extrapolation curve, a first reference curve, and a first straight line together with a portion, in a coordinate range of −71 mm to −66 mm (edge region), of a ridge line profile of the first surface of the glass substrate I.

FIG. 34 is an enlarged graph showing a first portion $\phi_1$ (thin broken line) of an extrapolation curve $\phi$ obtained by extrapolating the fitting curve F to the end of the effective region. Likewise, FIG. 35 is an enlarged graph showing a second portion $\phi_2$ (thin broken line) of the extrapolation curve $\phi$ obtained by extrapolating the fitting curve F to the end of the effective region.

A first reference curve $R_1$ was calculated by adding 3 nm to the height values of the first portion $\phi_1$. Likewise, a second reference curve $R_2$ was calculated by adding 3 nm to the height values of the second portion $\phi_2$.

Figure 35:
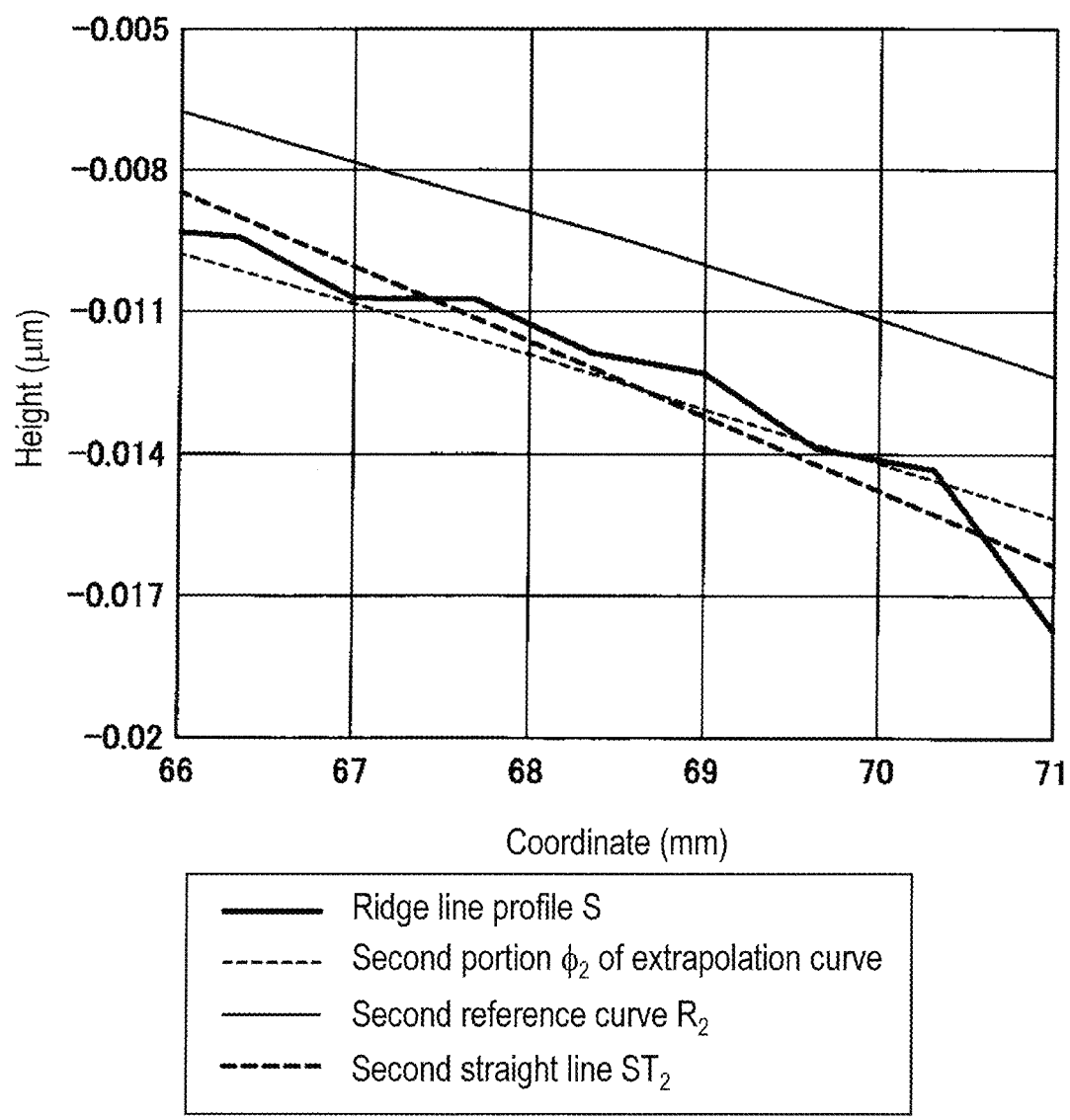
FIG. 35 is a graph showing a second portion of the extrapolation curve, a second reference curve, and a second straight line together with a portion, in a coordinate range of +66 mm to +71 mm (edge region), of the ridge line profile of the first surface of the glass substrate I.

FIG. 34 and FIG. 35 also show the first reference curve $R_1$ (thin solid line) and the second reference curve $R_2$ (thin solid line), respectively.

FIG. 34 also shows, together with the first portion $\phi_1$ (thin broken line) of the extrapolation curve $\phi$ and the first reference curve $R_1$ (thin solid line), a portion (thick solid line; hereinafter referred to as a "first corresponding portion"), in a coordinate range of −71 mm to −66 mm, of the ridge line profile S. FIG. 35 also shows, together with the second portion $\phi_2$ (thin broken line) of the extrapolation curve $\phi$ and the second reference curve $R_2$ (thin solid line), a portion (thick solid line; hereinafter referred to as a "second corresponding portion"), in a coordinate range of +66 mm to +71 mm, of the ridge line profile S.

Then, a first straight line $ST_1$ was calculated by performing straight line approximation of a least squares method on the points of the first corresponding portion (in the edge region) of the ridge line profile S. In addition, a second straight line $ST_2$ was calculated by performing straight line approximation of the least squares method on the points of the second corresponding portion (in the edge region) of the ridge line profile S.

FIG. 34 and FIG. 35 show, by thick broken lines, the first straight line $ST_1$ and the second straight line $ST_2$ obtained by the above manipulation, respectively.

Subsequently, a relative positional relationship between the first straight line $ST_1$ and the first reference curve $R_1$ and a relative positional relationship between the second straight line $ST_2$ and the second reference curve $R_2$ were judged.

As a result, it was found that in this case, as seen from FIG. 34, the first straight line $ST_1$ is located under the first reference curve $R_1$. In addition, it was found that in this case, as seen from FIG. 35, the second straight line $ST_2$ is located under the second reference curve $R_2$. Thus, it was judged that the ridge line profile S (see FIG. 33) of this particular vertical line Ta was in a proper form.

For the first and second surface, the above manipulations were performed for all of the particular vertical lines Ta and the particular horizontal lines Ua, and a percentage Q of ridge line profile S that were in a proper form was calculated.

The percentage Q was 80% in the first surface and 79% in the second surface.

Subsequently, flatness of the first surface and the second surface of the glass substrate I when the glass substrate I was chucked and placed on a mask stage was evaluated.

First, flatness of the first surface of the glass substrate I when its peripheral portion is chucked and placed on the mask stage was evaluated. As a result, the PV value ($PV_c$ mentioned above) in the effective region of the first surface was calculated to be 25 nm. Thus, the correction effectiveness factor V (%) which is given by the above-mentioned Equation (2) was calculated to be 58%.

In addition, flatness of the second surface of the glass substrate I when its peripheral portion is chucked and placed on the mask stage was evaluated. As a result, the PV value ($PV_c$ mentioned above) in the effective region of the second surface was calculated to be 22 nm. Thus, the correction effectiveness factor V (%) which is given by the above-mentioned Equation (2) with replacement of $PV_a$ with $PV_b$ was calculated to be 64%.

The kind of profile (convex profile or concave profile), the percentage Q, the PV value ($PV_a$ or $PV_b$) in the effective region before chucking, the PV value ($PV_c$) in the effective region after chucking, and the correction effectiveness factor V that were obtained for each of the first surface and the second surface of the glass substrate I are shown together in the row of the case No. 11 of the following Table 2:

TABLE 2

| Case No. | Surface | Kind of Profile | Percentage Q (%) | $PV_a$ or $PV_b$ (nm) | $PV_c$ (nm) | Correction effectiveness factor (%) |
|---|---|---|---|---|---|---|
| 11 | First | Convex | 80 | 60 | 25 | 58 |
|  | Second | Convex | 79 | 61 | 22 | 64 |
| 12 | First | Convex | 80 | 37 | 22 | 41 |
|  | Second | Convex | 82 | 30 | 17 | 43 |

(Case No. 12)

A glass substrate for a mask blank was produced by a method that is similar to the method employed in the case No. 11.

In the case No. 12, in the local polishing process for each of the first surface and the second surface, the polishing conditions for each side of the edge region of were made different from those in the case No. 11. More specifically, the same polishing conditions as in the case No. 2 were employed. The polishing conditions for the respective sides were set independently.

Both of the first surface and the second surface of a produced glass substrate (hereinafter referred to as a "glass substrate J") was evaluated by the same method as in the case No. 1.

Figure 36:
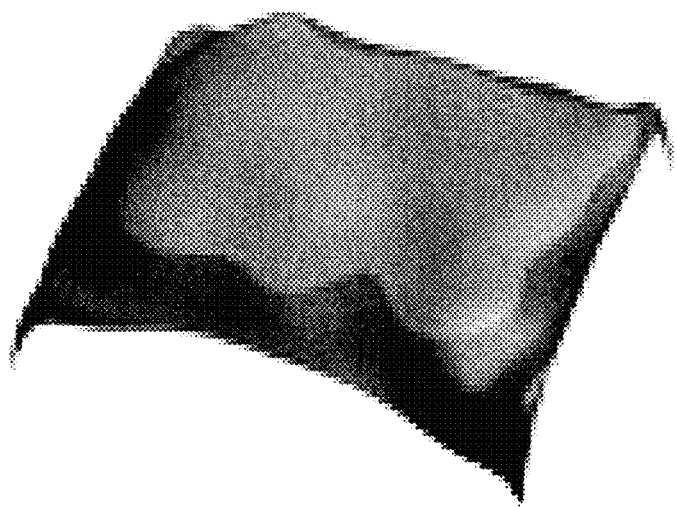
FIG. 36 is a bird's eye image prepared by filtering the data of a profile, measured in the effective region and having small projections and recesses, of the first surface of a glass substrate J.

FIG. 36 is a bird's eye image that was prepared from a profile measured in the effective region of the first surface of the glass substrate J. It is seen from FIG. 36 that the first surface of the glass substrate J had a convex profile.

Figure 37:
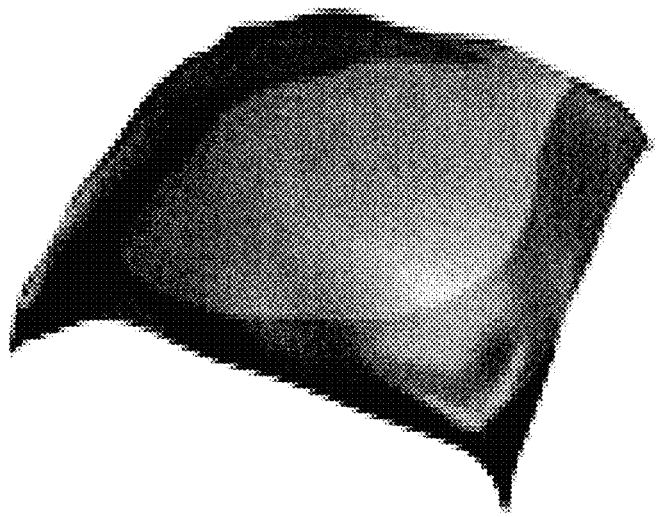
FIG. 37 is a bird's eye image prepared by filtering the data of a profile, measured in the effective region and having small projections and recesses, of the second surface of the glass substrate J.

FIG. 37 is a bird's eye image that was prepared from a profile measured in the effective region of the second surface of the glass substrate J. It is seen from FIG. 37 that the second surface of the glass substrate J had a convex profile.

The top-bottom direction of the bird's eye image of the second surface shown in FIG. 37 corresponds to that of the bird's eye image of the first surface shown in FIG. 36. That is, FIG. 36 and FIG. 37 correspond to the profile of the top surface (first surface) and the profile of the bottom surface (second surface), respectively, that were obtained when the glass substrate J was seen from a direction that was perpendicular to its thickness direction. In glass substrate J, both of the first surface and the second surface had a convex profile, and hence, the above mentioned matching conditions are satisfied.

The kind of profile (convex profile or concave profile), a percentage Q, a PV value ($PV_a$ or $PV_b$) in the effective region before chucking, a PV value ($PV_c$) in the effective region after chucking, and a correction effectiveness factor V that were obtained for each of the first surface and the second surface of the glass substrate J are shown together in the row of the case No. 12 in Table 2.

Figure 38:
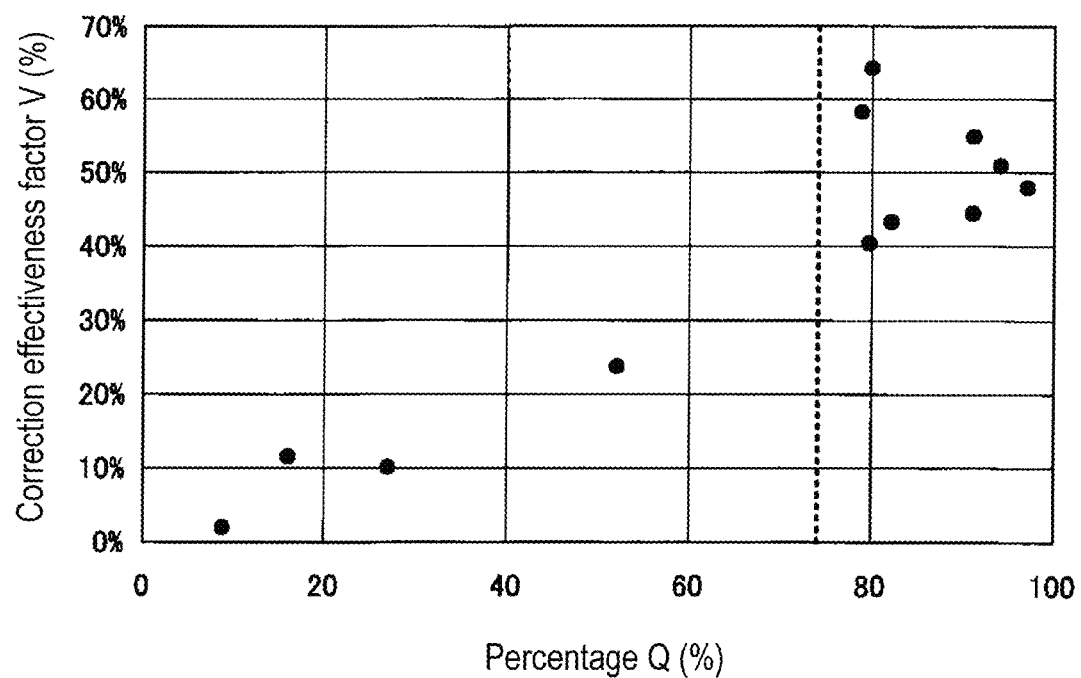
FIG. 38 is a graph showing a relationship between the percentage Q and the correction effectiveness factor V obtained as a result of the evaluation of the glass substrates A to J.

FIG. 38 is a graph showing a relationship between the percentage Q and the correction effectiveness factor V obtained as a result of the evaluation of the glass substrates A to J. In FIG. 38, the horizontal axis represents the percentage Q and the vertical axis represents the correction effectiveness factor V.

It is seen from FIG. 38 that the correction effectiveness factor V is significantly improved in the glass substrates whose percentage Q is higher than 75%.

As described above, to realize high levels of flatness that would be required for next-generation photomasks, it is necessary to combine realization of flatness of a glass substrate itself that is equal to or higher than a prescribed level and the effect of chucking deformation of a photomask.

In this regard, the glass substrates A to D and the glass substrates I and J have larger correction effectiveness factors V than the glass substrates E to H. Furthermore, the glass substrates A to D and the glass substrates I and J themselves have high flatness levels that are smaller than 70 nm. By virtue of the combination of these factors, in the glass substrates A to D and the glass substrates I and J, the flatness of the first surface of the glass substrate can be significantly improved ($PV_c$ can be decreased) when a photomask is chucked.

(Additional Evaluations)

The above-described evaluations, surface flatness when the glass substrate that is part of a transmission photomask was chucked and placed on a mask stage was evaluated.

Consideration will now be given to surface flatness when a glass substrate that is part of a reflection photomask is chucked and placed on a mask stage.

In the case of reflection photomasks, the entire back surface (hereinafter referred to as a "second surface") is placed on the mask stage of an exposing machine. At this time, the second surface is deformed so as to conform to the mask stage, and as a result, the first surface of the glass substrate is deformed accordingly. Thus, the flatness of the first surface after the chucking is influenced by the flatness levels of both of the first surface and the second surface before the chucking.

Assume here that the first surface and the second surface satisfy the above-described matching conditions.

For example, in a case where both of the first surface and the second surface have a convex profile, the second surface is deformed by the chucking in such a direction as to be flattened, that is, to be reduced in convexity. The first surface is deformed accordingly in such a direction as to be flattened, that is, to be reduced in convexity.

Likewise, in a case where both of the first surface and the second surface have a concave profile, when the second surface is deformed by the chucking in such a direction as to be flattened, the first surface is deformed accordingly in such a direction as to be flattened, that is, to be reduced in concavity.

Thus, in a case where the first surface and the second surface satisfy the above-described matching conditions, the flatness of the first surface can be improved in a preferable manner by chucking.

Conversely, if the first surface and the second surface do not satisfy the above-described matching conditions, the flatness of the first surface may be lowered when the second surface is deformed by chucking.

As is found from the above description, in reflection photomasks and glass substrates for a reflection mask blank, it would be important that the above-described conditions be satisfied, that is, $PV_a$ be 70 nm or less, the percentages Q be 75% or more, and the first surface and the second surface satisfy the above-described matching conditions.

The glass substrates I and J were used as glass substrates for evaluation.

Assuming that the glass substrates I and J are to be used as part of a reflection photomask, deformation to be caused by chucking was calculated in accordance with a quadratic function and the first surface and the second surface are approximated by a quadratic function. A warp of each of the entire glass substrates I and J is calculated using the coefficients obtained by the two kinds of calculations. Flatness of the first surface after the chucking is then calculated by subtracting the warp of the entire glass substrate I or J from the shape of its first surface before the chucking.

As a result of the above-described evaluation, the PV value in the effective region of its first surface when the glass substrate I is chucked and placed on a mask stage was calculated to be 28 nm.

Thus, a second correction effectiveness factor $V_2$ which is given by the following Equation (3) was calculated to be 53%.

$$V_2(\%) = (1 - PV_d/PV_a) \times 100 \quad (3)$$

where $PV_a$ is the PV value in the effective region of the first surface before the correction in accordance with the above-mentioned quadratic function $Z_{fit}$ and $PV_d$ is the PV value in the effective region of the first surface after chucking and placement on a mask stage.

Likewise, as a result of the above-described evaluation, the PV value ($PV_d$) in the effective region of its first surface when the glass substrate J is chucked and placed on a mask stage was calculated to be 25 nm.

The PV values ($PV_d$) in the effective region and the second correction effectiveness factors $V_2$ obtained for the glass substrates I and J are summarized in the following Table 3.

TABLE 3

| Case No. | PV$_d$ (nm) | Second correction effectiveness factor V$_2$ (%) |
|---|---|---|
| 11 | 28 | 53 |
| 12 | 25 | 40 |

As seen from Table 3, in the glass substrates I and J in which the first surface and the second surface satisfy the matching conditions, it was confirmed that sufficiently high flatness could be obtained after chucking.

While the present invention has been described in detail and with reference to specific embodiments thereof, it will be apparent to one skilled in the art that various changes and modifications can be made therein without departing from the spirit and scope thereof.

DESCRIPTION OF REFERENCE NUMERALS AND SIGNS

100: First glass substrate
110A: First surface
110B: Second surface
130A: Central region
132A: Peripheral region
132A-1: First section of peripheral region
132A-2: Second section of peripheral region
132A-3: Third section of peripheral region
132A-4: Fourth section of peripheral region
135A: Edge region
135A-1: First section of edge region
135A-2: Second section of edge region
135A-3: Third section of edge region
135A-4: Fourth section of edge region
140A: Non-edge region
150A: Effective region
155A: Ineffective region
200: Second glass substrate
210A: First surface
210B: Second surface
230A: First central region
230B: Second central region
300: First mask blank
300A: Transmission photomask
302: First surface of first mask blank
304: Second surface of first mask blank
308: Glass substrate
310A: First surface
310B: Second surface
360: Light shield film
360A: Patterned light shield film
400: Second mask blank
400A: Reflection photomask
402: First surface of second mask blank
404: Second surface of second mask blank
408: Glass substrate
410A: First surface
410B: Second surface
470: Reflection film
480: Absorption film
480A: Patterned absorption film
490: Conductive film
F: Fitting curve
R$_1$: First reference curve
S: Ridge line profile
ST$_1$: First straight line
Ta: Particular vertical line
Ua: Particular horizontal line
φ$_1$: First portion of extrapolation curve

The invention claimed is:

1. A glass substrate for a mask blank, comprising a first surface and a second surface, which face each other and each of which is approximately square having a vertical length (P) and a horizontal length (P) being equal to the vertical length (P), wherein:

in the first surface, a first square having a center coinciding with a center of the first surface and sides which are parallel with respective sides of the first surface and have a length P1 of 104 mm, a second square having a center coinciding with the center of the first surface and sides which are parallel with the respective sides of the first surface and have a length P2 of 132 mm, and a third square having a center coinciding with the center of the first surface and sides which are parallel with the respective sides of the first surface and have a length P3 of 142 mm, are assumed;

a region inside the first square, the region including the first square, is referred to as a central region, a region enclosed by the second square and the first square, the region including the second square but not including the first square, is referred to as a peripheral region, a region enclosed by the third square and the second square, the region including the third square but not including the second square, is referred to as an edge region, a region inside the second square, the region including the second square, is referred to as a non-edge region, and a region inside the third square, the region including the third square, is referred to as an effective region;

in the effective region of the first surface, 100 or more vertical lines are drawn in the vertical direction at same interval d and 100 or more horizontal lines are drawn in the horizontal direction at same interval d, and a profile is recognized by measuring relative heights at respective measurement positions in a cross section taken along each of the vertical lines and the horizontal lines;

the profile of the first surface is judged as a convex profile if an average value of heights at measurement positions on all of the vertical lines and the horizontal lines in the central region is higher than an average value of heights at measurement positions on all of the vertical lines and the horizontal lines in the peripheral region, whereas the profile of the first surface is judged as a concave profile if the average value of heights at the measurement positions on all of the vertical lines and the horizontal lines in the central region is lower than the average value of heights at the measurement positions on all of the vertical lines and the horizontal lines in the peripheral region;

among the vertical lines, a vertical line that crosses, in the following order, the edge region which is referred to as a first section of the edge region, the peripheral region which is referred to as a first section of the peripheral region, the central region, the peripheral region which is referred to as a second section of the peripheral region, and the edge region which is referred to as a second section of the edge region, is referred to as a particular vertical line;

among the horizontal lines, a horizontal line that crosses, in the following order, the edge region which is referred to as a third section of the edge region, the peripheral region which is referred to as a third section of the peripheral region, the central region, the peripheral region which is referred to as a fourth section of the peripheral region, and the edge region which is referred to as a fourth section of the edge region, is referred to as a particular horizontal line;

a peak-to-valley (PV) value in the effective region is 70 nm or less;

(i) in a case where the profile of the first surface is the convex profile, when a profile curve is drawn by a curve fitting based on each measurement point in the non-edge region in a profile in a cross section taken along each of the particular vertical line and the particular horizontal line, an extrapolation curve having a first portion $\phi_1$ in the first section or third section of the edge region and a second portion $\phi_2$ in the second section or fourth section of the edge region is drawn by extrapolating the profile curve to the ends of the effective region, and a first reference curve $R_1$ and a second reference curve $R_2$ are drawn by adding 3 nm to heights of the first portion $\phi_1$ and the second portion $\phi_2$, respectively, a mode which a first straight line obtained by straight-line-approximating measurement points of the profile in the first section or third section of the edge region is located under the first reference curve $R_1$ and a second straight line obtained by straight-line-approximating measurement points of the profile in the second section or fourth section of the edge region is located under the second reference curve $R_2$ holds in 75% or more of the cross sections taken along all of the particular vertical lines and the particular horizontal lines; and (ii) in a case where the profile of the first surface is the concave profile, when a profile curve is drawn by a curve fitting based on each measurement point in the non-edge region in a profile in a cross section taken along each of the particular vertical lines and the particular horizontal lines, an extrapolation curve having a first portion $\phi_1$ in the first section or third section of the edge region and a second portion $\phi_2$ in the second section or fourth section of the edge region is drawn by extrapolating the profile curve to the ends of the effective region, and a first reference curve $R_1$ and a second reference curve $R_2$ are drawn by subtracting 3 nm from heights of the first portion $\phi_1$ and the second portion $\phi_2$, respectively, a mode which a first straight line obtained by straight-line-approximating measurement points of the profile in the first section or third section of the edge region is located over the first reference curve $R_1$ and a second straight line obtained by straight-line-approximating measurement points of the profile in the second section or fourth section of the edge region is located over the second reference curve $R_2$ holds in 75% or more of the cross sections taken along all of the particular vertical lines and the particular horizontal lines.

2. A mask blank comprising:
the glass substrate according to claim 1; and
a film formed on the first surface of the glass substrate.

3. The mask blank according to claim 2, wherein the film is a light shield film that interrupts light in a particular wavelength range.

4. The glass substrate according to claim 1, wherein:
in the second surface, a fourth square having a center coinciding with a center of the second surface and sides which are parallel with respective sides of the second surface and have a length P1 of 104 mm, a fifth square having a center coinciding with the center of the second surface and sides which are parallel with the respective sides of the second surface and have a length P2 of 132 mm, and a sixth square having a center coinciding with the center of the second surface and sides which are parallel with the respective sides of the second surface and have a length P3 of 142 mm, are assumed;

a region inside the fourth square, the region including the fourth square, is referred to as a second central region, a region enclosed by the fifth square and the fourth square, the region including the fifth square but not including the fourth square, is referred to as a second peripheral region, a region enclosed by the sixth square and the fifth square, the region including the sixth square but not including the fifth square, is referred to as a second edge region, a region inside the fifth square, the region including the fifth square, is referred to as a second non-edge region, and a region inside the sixth square, the region including the sixth square, is referred to as a second effective region;

a profile of the second surface is judged as a convex profile or a concave profile in the same manner as in the case of the first surface;

a peak-to-valley (PV) value in the second effective region is 70 nm or less;

in a case where the profile of the second surface is the convex profile, when the same manipulations as performed in the case of the first surface are performed, a mode which a first straight line obtained by straight-line-approximating measurement points of the profile in the first section or third section of the second edge region is located under the first reference curve $R_1$ and a second straight line obtained by straight-line-approximating measurement points of the profile in the second section or fourth section of the second edge region is located under the second reference curve $R_2$ holds in 75% or more of the cross sections taken along all of the particular vertical lines and the particular horizontal lines;

in a case where the profile of the second surface is the convex profile, when the same manipulations as performed in the case of the first surface are performed, a mode which a first straight line obtained by straight-line-approximating measurement points of the profile in the first section or third section of the second edge region is located over the first reference curve $R_1$ and a second straight line obtained by straight-line-approximating measurement points of the profile in the second section or fourth section of the second edge region is located over the second reference curve $R_2$ holds in 75% or more of the cross sections taken along all of the particular vertical lines and the particular horizontal lines;

in a case where the profile of the first surface is the convex profile, when the central region of the first surface and the second central region of the second surface are integrally observed from a direction perpendicular to a thickness direction of the glass substrate, the central region of the first surface relatively projects to the side opposite to the second central region and the second central region relatively projects to the side of the central region of the first surface; and in a case where the profile of the first surface is the concave profile, when the central region of the first surface and the second central region of the second surface are integrally observed from a direction perpendicular to a thickness direction of the glass substrate, the central region of the first surface relatively projects to the side of the second central region and the second central region relatively projects to the side opposite to the central region of the first surface.

5. A mask blank comprising:
the glass substrate according to claim 4; and
a film formed on the first surface of the glass substrate.

6. The mask blank according to claim 5, wherein the film comprises an absorption film that absorbs light in a particular wavelength range and a reflection film that reflects the light.

7. A mask blank comprising:
a glass substrate; and
a film formed on a surface of the glass substrate, wherein:
the glass substrate comprises a first surface and a second surface, which face each other and each of which is approximately square having a vertical length (P) and a horizontal length (P) being equal to the vertical length (P);
in the first surface, a first square having a center coinciding with a center of the first surface and sides which are parallel with respective sides of the first surface and have a length P1 of 104 mm, a second square having a center coinciding with the center of the first surface and sides which are parallel with the respective sides of the first surface and have a length P2 of 132 mm, and a third square having a center coinciding with the center of the first surface and sides which are parallel with the respective sides of the first surface and have a length P3 of 142 mm, are assumed;
a region inside the first square, the region including the first square, is referred to as a central region,
a region enclosed by the second square and the first square, the region including the second square but not including the first square, is referred to as a peripheral region,
a region enclosed by the third square and the second square, the region including the third square but not including the second square, is referred to as an edge region,
a region inside the second square, the region including the second square, is referred to as a non-edge region, and
a region inside the third square, the region including the third square, is referred to as an effective region;
in the effective region of the first surface, 100 or more vertical lines are drawn in the vertical direction at same interval d and 100 or more horizontal lines are drawn in the horizontal direction at same interval d, and a profile is recognized by measuring relative heights at respective measurement positions in a cross section taken along each of the vertical lines and the horizontal lines;
the profile of the first surface is judged as a convex profile if an average value of heights at measurement positions on all of the vertical lines and the horizontal lines in the central region is higher than an average value of heights at measurement positions on all of the vertical lines and the horizontal lines in the peripheral region, whereas the profile of the first surface is judged as a concave profile if the average value of heights at the measurement positions on all of the vertical lines and the horizontal lines in the central region is lower than the average value of heights at the measurement positions on all of the vertical lines and the horizontal lines in the peripheral region;

among the vertical lines, a vertical line that crosses, in the following order, the edge region which is referred to as a first section of the edge region, the peripheral region which is referred to as a first section of the peripheral region, the central region, the peripheral region which is referred to as a second section of the peripheral region, and the edge region which is referred to as a second section of the edge region, is referred to as a particular vertical line;

among the horizontal lines, a horizontal line that crosses, in the following order, the edge region which is referred to as a third section of the edge region, the peripheral region which is referred to as a third section of the peripheral region, the central region, the peripheral region which is referred to as a fourth section of the peripheral region, and the edge region which is referred to as a fourth section of the edge region, is referred to as a particular horizontal line;

a peak-to-valley (PV) value in the effective region is 70 nm or less;

(i) in a case where the profile of the first surface is the convex profile, when a profile curve is drawn by a curve fitting based on each measurement point in the non-edge region in a profile in a cross section taken along each of the particular vertical line and the particular horizontal line, an extrapolation curve having a first portion $\phi_1$ in the first section or third section of the edge region and a second portion $\phi_2$ in the second section or fourth section of the edge region is drawn by extrapolating the profile curve to the ends of the effective region, and a first reference curve $R_1$ and a second reference curve $R_2$ are drawn by adding 3 nm to heights of the first portion $\phi_1$ and the second portion $\phi_2$, respectively, a mode which a first straight line obtained by straight-line-approximating measurement points of the profile in the first section or third section of the edge region is located under the first reference curve $R_1$ and a second straight line obtained by straight-line-approximating measurement points of the profile in the second section or fourth section of the edge region is located under the second reference curve $R_2$ holds in 75% or more of the cross sections taken along all of the particular vertical lines and the particular horizontal lines; and (ii) in a case where the profile of the first surface is the concave profile, when a profile curve is drawn by a curve fitting based on each measurement point in the non-edge region in a profile in a cross section taken along each of the particular vertical lines and the particular horizontal lines, an extrapolation curve having a first portion $\phi_1$ in the first section or third section of the edge region and a second portion $\phi_2$ in the second section or fourth section of the edge region is drawn by extrapolating the profile curve to the ends of the effective region, and a first reference curve $R_1$ and a second reference curve $R_2$ are drawn by subtracting 3 nm from heights of the first portion $\phi_1$ and the second portion $\phi_2$, respectively, a mode which a first straight line obtained by straight-line-approximating measurement points of the profile in the first section or third section of the edge region is located over the first reference curve $R_1$ and a second straight line obtained by straight-line-approximating measurement points of the profile in the second section or fourth section of the edge region is located over the second reference curve $R_2$ holds in 75% or more of the cross sections taken along all of the particular vertical lines and the particular horizontal lines.

8. The mask blank according to claim 7, wherein the film is a light shield film that interrupts light in a particular wavelength range and is formed on the side of the first surface.

9. The mask blank according to claim 7, wherein:
in the second surface, a fourth square having a center coinciding with a center of the second surface and sides which are parallel with respective sides of the second surface and have a length P1 of 104 mm, a fifth square having a center coinciding with the center of the second surface and sides which are parallel with the respective sides of the second surface and have a length P2 of 132 mm, and a sixth square having a center coinciding with the center of the second surface and sides which are parallel with the respective sides of the second surface and have a length P3 of 142 mm, are assumed;
a region inside the fourth square, the region including the fourth square, is referred to as a second central region,
a region enclosed by the fifth square and the fourth square, the region including the fifth square but not including the fourth square, is referred to as a second peripheral region,
a region enclosed by the sixth square and the fifth square, the region including the sixth square but not including the fifth square, is referred to as a second edge region,
a region inside the fifth square, the region including the fifth square, is referred to as a second non-edge region, and
a region inside the sixth square, the region including the sixth square, is referred to as a second effective region;
a profile of the second surface is judged as a convex profile or a concave profile in the same manner as in the case of the first surface;
a peak-to-valley (PV) value in the second effective region is 70 nm or less;
in a case where the profile of the second surface is the convex profile, when the same manipulations as performed in the case of the first surface are performed, a mode which a first straight line obtained by straight-line-approximating measurement points of the profile in the first section or third section of the second edge region is located under the first reference curve $R_1$ and a second straight line obtained by straight-line-approximating measurement points of the profile in the second section or fourth section of the second edge region is located under the second reference curve $R_2$ holds in 75% or more of the cross sections taken along all of the particular vertical lines and the particular horizontal lines;
in a case where the profile of the second surface is the convex profile, when the same manipulations as performed in the case of the first surface are performed, a mode which a first straight line obtained by straight-line-approximating measurement points of the profile in the first section or third section of the second edge region is located over the first reference curve $R_1$ and a second straight line obtained by straight-line-approximating measurement points of the profile in the second section or fourth section of the second edge region is located over the second reference curve $R_2$ holds in 75% or more of the cross sections taken along all of the particular vertical lines and the particular horizontal lines;
in a case where the profile of the first surface is the convex profile, when the central region of the first surface and the second central region of the second surface are integrally observed from a direction perpendicular to a thickness direction of the glass substrate, the central region of the first surface relatively projects to the side opposite to the second central region and the second central region relatively projects to the side of the central region of the first surface; and
in a case where the profile of the first surface is the concave profile, when the central region of the first surface and the second central region of the second surface are integrally observed from a direction perpendicular to a thickness direction of the glass substrate, the central region of the first surface relatively projects to the side of the second central region and the second central region relatively projects to the side opposite to the central region of the first surface.

10. The mask blank according to claim 9, wherein the film comprises an absorption film that absorbs light in a particular wavelength range and a reflection film that reflects the light.

11. A photomask comprising:
a glass substrate; and
a patterned film formed on a surface of the glass substrate, wherein:
the glass substrate comprises a first surface and a second surface, which face each other and each of which is approximately square having a vertical length (P) and a horizontal length (P) being equal to the vertical length (P);
in the first surface, a first square having a center coinciding with a center of the first surface and sides which are parallel with respective sides of the first surface and have a length P1 of 104 mm, a second square having a center coinciding with the center of the first surface and sides which are parallel with the respective sides of the first surface and have a length P2 of 132 mm, and a third square having a center coinciding with the center of the first surface and sides which are parallel with the respective sides of the first surface and have a length P3 of 142 mm, are assumed;
a region inside the first square, the region including the first square, is referred to as a central region,
a region enclosed by the second square and the first square, the region including the second square but not including the first square, is referred to as a peripheral region,
a region enclosed by the third square and the second square, the region including the third square but not including the second square, is referred to as an edge region,
a region inside the second square, the region including the second square, is referred to as a non-edge region, and
a region inside the third square, the region including the third square, is referred to as an effective region;
in the effective region of the first surface, 100 or more vertical lines are drawn in the vertical direction at same interval d and 100 or more horizontal lines are drawn in the horizontal direction at same interval d, and a profile is recognized by measuring relative heights at respective measurement positions in a cross section taken along each of the vertical lines and the horizontal lines;
the profile of the first surface is judged as a convex profile if an average value of heights at measurement positions on all of the vertical lines and the horizontal lines in the central region is higher than an average value of heights at measurement positions on all of the vertical lines and the horizontal lines in the peripheral region, whereas the profile of the first surface is judged as a concave profile if the average value of heights at the measurement positions on all of the vertical lines and the horizontal lines in the central region is lower than the average value of heights at the measurement positions on all of the vertical lines and the horizontal lines in the peripheral region;

among the vertical lines, a vertical line that crosses, in the following order, the edge region which is referred to as a first section of the edge region, the peripheral region which is referred to as a first section of the peripheral region, the central region, the peripheral region which is referred to as a second section of the peripheral region, and the edge region which is referred to as a second section of the edge region, is referred to as a particular vertical line;

among the horizontal lines, a horizontal line that crosses, in the following order, the edge region which is referred to as a third section of the edge region, the peripheral region which is referred to as a third section of the peripheral region, the central region, the peripheral region which is referred to as a fourth section of the peripheral region, and the edge region which is referred to as a fourth section of the edge region, is referred to as a particular horizontal line;

a peak-to-valley (PV) value in the effective region is 70 nm or less;

(i) in a case where the profile of the first surface is the convex profile, when a profile curve is drawn by a curve fitting based on each measurement point in the non-edge region in a profile in a cross section taken along each of the particular vertical line and the particular horizontal line, an extrapolation curve having a first portion $\phi_1$ in the first section or third section of the edge region and a second portion $\phi_2$ in the second section or fourth section of the edge region is drawn by extrapolating the profile curve to the ends of the effective region, and a first reference curve $R_1$ and a second reference curve $R_2$ are drawn by adding 3 nm to heights of the first portion $\phi_1$ and the second portion $\phi_2$, respectively, a mode which a first straight line obtained by straight-line-approximating measurement points of the profile in the first section or third section of the edge region is located under the first reference curve $R_1$ and a second straight line obtained by straight-line-approximating measurement points of the profile in the second section or fourth section of the edge region is located under the second reference curve $R_2$ holds in 75% or more of the cross sections taken along all of the particular vertical lines and the particular horizontal lines; and (ii) in a case where the profile of the first surface is the concave profile, when a profile curve is drawn by a curve fitting based on each measurement point in the non-edge region in a profile in a cross section taken along each of the particular vertical lines and the particular horizontal lines, an extrapolation curve having a first portion $\phi_1$ in the first section or third section of the edge region and a second portion $\phi_2$ in the second section or fourth section of the edge region is drawn by extrapolating the profile curve to the ends of the effective region, and a first reference curve $R_1$ and a second reference curve $R_2$ are drawn by subtracting 3 nm from heights of the first portion $\phi_1$ and the second portion $\phi_2$, respectively, a mode which a first straight line obtained by straight-line-approximating measurement points of the profile in the first section or third section of the edge region is located over the first reference curve $R_1$ and a second straight line obtained by straight-line-approximating measurement points of the profile in the second section or fourth section of the edge region is located over the second reference curve $R_2$ holds in 75% or more of the cross sections taken along all of the particular vertical lines and the particular horizontal lines.

12. The photomask according to claim 11, wherein the film is a light shield film that interrupts light in a particular wavelength range and is formed on the side of the first surface.

13. The photomask according to claim 11, wherein:

in the second surface, a fourth square having a center coinciding with a center of the second surface and sides which are parallel with respective sides of the second surface and have a length P1 of 104 mm, a fifth square having a center coinciding with the center of the second surface and sides which are parallel with the respective sides of the second surface and have a length P2 of 132 mm, and a sixth square having a center coinciding with the center of the second surface and sides which are parallel with the respective sides of the second surface and have a length P3 of 142 mm, are assumed;

a region inside the fourth square, the region including the fourth square, is referred to as a second central region, a region enclosed by the fifth square and the fourth square, the region including the fifth square but not including the fourth square, is referred to as a second peripheral region, a region enclosed by the sixth square and the fifth square, the region including the sixth square but not including the fifth square, is referred to as a second edge region, a region inside the fifth square, the region including the fifth square, is referred to as a second non-edge region, and a region inside the sixth square, the region including the sixth square, is referred to as a second effective region;

a profile of the second surface is judged as a convex profile or a concave profile in the same manner as in the case of the first surface;

a peak-to-valley (PV) value in the second effective region is 70 nm or less;

in a case where the profile of the second surface is the convex profile, when the same manipulations as performed in the case of the first surface are performed, a mode which a first straight line obtained by straight-line-approximating measurement points of the profile in the first section or third section of the second edge region is located under the first reference curve $R_1$ and a second straight line obtained by straight-line-approximating measurement points of the profile in the second section or fourth section of the second edge region is located under the second reference curve $R_2$ holds in 75% or more of the cross sections taken along all of the particular vertical lines and the particular horizontal lines;

in a case where the profile of the second surface is the convex profile, when the same manipulations as performed in the case of the first surface are performed, a mode which a first straight line obtained by straight-line-approximating measurement points of the profile in the first section or third section of the second edge region is located over the first reference curve $R_1$ and a second straight line obtained by straight-line-approximating measurement points of the profile in the second section or fourth section of the second edge region is located over the second reference curve $R_2$ holds in 75% or more of the cross sections taken along all of the particular vertical lines and the particular horizontal lines;

in a case where the profile of the first surface is the convex profile, when the central region of the first surface and the second central region of the second surface are integrally observed from a direction perpendicular to a thickness direction of the glass substrate, the central region of the first surface relatively projects to the side opposite to the second central region and the second central region relatively projects to the side of the central region of the first surface; and in a case where the profile of the first surface is the concave profile, when the central region of the first surface and the second central region of the second surface are integrally observed from a direction perpendicular to a thickness direction of the glass substrate, the central region of the first surface relatively projects to the side of the second central region and the second central region relatively projects to the side opposite to the central region of the first surface.

14. The photomask according to claim 13, wherein the film comprises an absorption film that absorbs light in a particular wavelength range and a reflection film that reflects the light.

* * * * *